United States Patent
Wu et al.

(10) Patent No.: US 12,272,631 B2
(45) Date of Patent: Apr. 8, 2025

(54) SEMICONDUCTOR PACKAGE HAVING MULTIPLE SUBSTRATES

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/447,008

(22) Filed: Aug. 9, 2023

(65) Prior Publication Data

US 2024/0021506 A1    Jan. 18, 2024

Related U.S. Application Data

(62) Division of application No. 17/233,081, filed on Apr. 16, 2021.

(51) Int. Cl.
*H01L 23/498* (2006.01)
*H01L 23/00* (2006.01)

(52) U.S. Cl.
CPC .. *H01L 23/49822* (2013.01); *H01L 23/49816* (2013.01); *H01L 23/49827* (2013.01); *H01L 23/49833* (2013.01); *H01L 23/49866* (2013.01); *H01L 23/562* (2013.01)

(58) Field of Classification Search
CPC ......... H01L 23/49822; H01L 23/49816; H01L 23/49827; H01L 23/49833; H01L 23/28; H01L 24/18
See application file for complete search history.

(56) References Cited

U.S. PATENT DOCUMENTS

| | | |
|---|---|---|
| 5,375,042 A | 12/1994 | Arima et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,922,845 B1 | 3/2018 | Shih |
| 9,922,924 B1 | 3/2018 | Shih |

(Continued)

FOREIGN PATENT DOCUMENTS

TW       2020022955 A       6/2020

*Primary Examiner* — Phat X Cao
(74) *Attorney, Agent, or Firm* — Slater Matsil, LLP

(57) ABSTRACT

A semiconductor device and method of manufacture is provided including a redistribution structure; a plurality of core substrates attached to the redistribution structure using conductive connectors, each core substrate of the plurality of core substrates comprising a plurality of conductive posts; and one or more molding layers encapsulating the plurality of core substrates, where the one or more molding layers extends along sidewalls of the plurality of core substrates, and where the one or more molding layers extends along a portion of a sidewall of each of the conductive posts.

20 Claims, 37 Drawing Sheets

(56) References Cited

U.S. PATENT DOCUMENTS

| | | |
|---|---|---|
| 11,171,090 B2 | 11/2021 | Wu et al. |
| 2016/0118312 A1* | 4/2016 | Hu ..................... H05K 1/0298 |
| | | 174/251 |
| 2020/0075488 A1* | 3/2020 | Wu ........................ H01L 24/96 |
| 2020/0312715 A1 | 10/2020 | Choi et al. |
| 2020/0395280 A1 | 12/2020 | Chen et al. |
| 2021/0035949 A1 | 2/2021 | Huang |
| 2021/0098353 A1 | 4/2021 | Wu et al. |
| 2021/0159168 A1* | 5/2021 | Huang ................ H01L 23/5384 |

* cited by examiner

SEMICONDUCTOR PACKAGE HAVING MULTIPLE SUBSTRATES

CROSS-REFERENCE TO RELATED APPLICATIONS

This application is a divisional of U.S. application Ser. No. 17/233,081, filed on Apr. 16, 2021, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
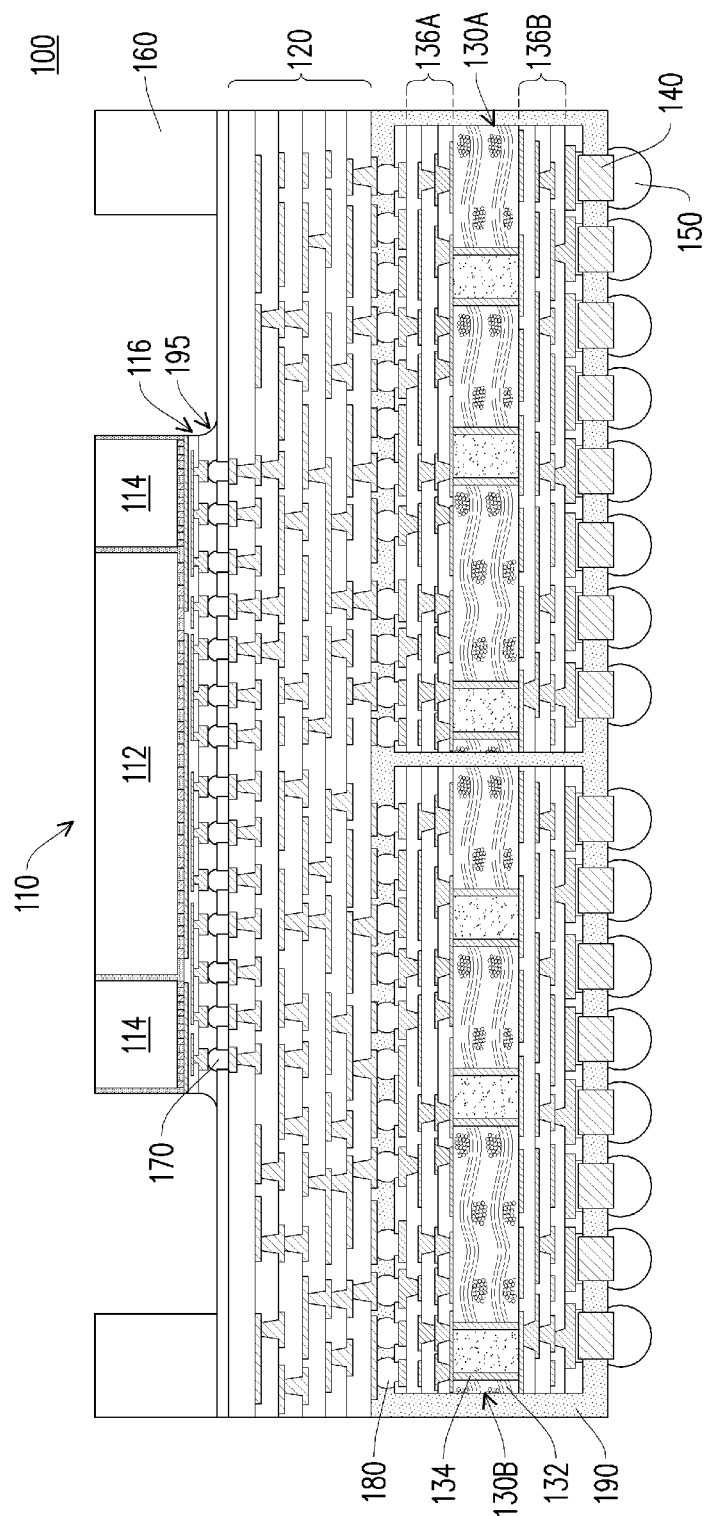
FIG. 1 illustrates a cross-sectional view of a package component in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a package component is formed having one or more integrated circuit dies. Discrete copper (Cu) post structures are formed on the bottom of two or more discrete core substrates. The two or more core substrates are attached, via solder joints or the like, to a redistribution structure build up. Over molding is applied to the RDL build up and two or more core substrates. A grinding process is performed on the side of the resulting structure containing the Cu post structures to level the molding to the Cu post structures. Plasma etching may be performed further expose the Cu posts from the molding, and BGA ball mounting may be performed on the exposed Cu posts such that the ball of the BGA encapsulates the face and a portion of the sidewall of each Cu post.

By using processes such as those described herein, it is possible to mitigate substrate thickness variation and improve ball grid array (BGA) coplanarity in a system on integrated substrate (SoIS) approach. Further, board level reliability can be enhanced, core substrate costs mitigated, higher yield substrates recognized due to the ability to integrate multiple smaller core substrates, and BGA ball coplanarity can be well managed as the Cu post formations provide a planar base independent of core substrate variations or warpage. Additionally, component reliability is increased by using of chip package integration (CPI) techniques and controlled collapse chip connection ($C_4$) bumps fatigue risk can be reduced. In some embodiments, $C_4$ bump joint stress can be reduced by 15%. The system described herein further provides a high potential for extensive integration of tensor processing unit (TPU) applications In accordance with some embodiments, conductive connectors used to connect the core substrate to the redistribution structure may take the form of, for example, a ball grid array (BGA). Integration of such conductive connectors may provide flexibility in placement for semiconductor devices, such as integrated power delivery (IPD) chips, including integrated voltage regulators (IVRs) and active chips, among other electrical components, to implement system-on-a-chip type of package components, thus reducing fabrication complexity. Such embodiments may also provide a greater amount of flexibility for various other package configurations as well.

FIG. 1 illustrates a cross-sectional view of a singulated package component 100 in accordance with some embodiments. The singulated package component 100 includes a semiconductor device (e.g., an integrated circuit package no) coupled to a redistribution structure 120 having one or more redistribution layers by conductive connectors 170. A protective ring 160 may be coupled to the redistribution structure 120 and extend along a periphery of the integrated circuit package no. A plurality of core substrates 130A and 130B are coupled to the redistribution structure 120 on a side opposite the integrated circuit package no by conductive connectors 180. Conductive posts 140 and external connectors 150 provide an electrical connection to the plurality of core substrates 130 on a side of the plurality of core substrates 130 opposite the redistribution structure 120. An encapsulant 190, such as molding film, or the like, encapsulates the plurality of core substrates 130, conductive posts 140 and the second side of the redistribution structure 120, among other elements.

The integrated circuit package no may include a plurality of integrated circuit dies, such as a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an input/output (I/O) die, the like, or combinations thereof. As shown, the integrated circuit package no includes a logic die 112, and two I/O dies 114 for illustrative purposes. The integrated circuit dies may be formed in one or more wafers, which may include different device regions that are singulated in subsequent steps. The integrated circuit dies may be packaged with other similar or different integrated circuit dies using manufacturing techniques such as an InFO package. The integrated circuit package no may include a redistribution structure 116, providing electrical pathing and connection between, for example, the logic die 112 and the I/O dies 114, as well as connection from the integrated circuit package to conductive connectors 170.

Conductive connectors 170 provide the electrical connection between the redistribution structure 120 and the integrated circuit package 110. An underfill 195 may be included to securely bond the integrated circuit package no to the redistribution structure 120 and provide structural support and environmental protection.

As discussed in greater detail below, the redistribution structure 120 provides electrical pathing and connection between the integrated circuit package no and the plurality of core substrates 130 via conductive connectors 170 and 180. In some embodiments, the redistribution structure 120 has one or more redistribution layers comprising metallization patterns, comprising, for example, conductive lines and conductive vias, and dielectric layers separating adjacent layers of the conductive lines as discussed below, for example, in relation to FIGS. 9-14. The conductive lines of metallization patterns may be interconnected with an overlying or underlying conductive feature using the conductive vias.

The redistribution structure 120 may be electrically and mechanically attached to the plurality of core substrates 130. Each of the plurality of core substrates 130 may include a core 132, with conductive vias 134 extending through the core 132, and additional optional redistribution structures 136 along opposing sides of the core 132. Generally, the plurality of core substrates 130 provides structural support for the component package, as well as providing electrical signal routing between the integrated circuit package and the external connectors 150.

FIGS. 2 through 8 illustrate various intermediate stages in processing each of the plurality of core substrates 130, in accordance with some embodiments.

Utilizing the plurality of core substrates 130 has the advantage of having the plurality of core substrates 130 being manufactured in separate processes. In addition, because the plurality of core substrates 130 are formed in separate processes, they can be tested separately so that a known good core substrate is used. For example, in some embodiments, the plurality of core substrates 130 may be individually or batch tested, validated, and/or verified prior to bonding the plurality of core substrates 130 to the redistribution structure 120.

Figure 2:
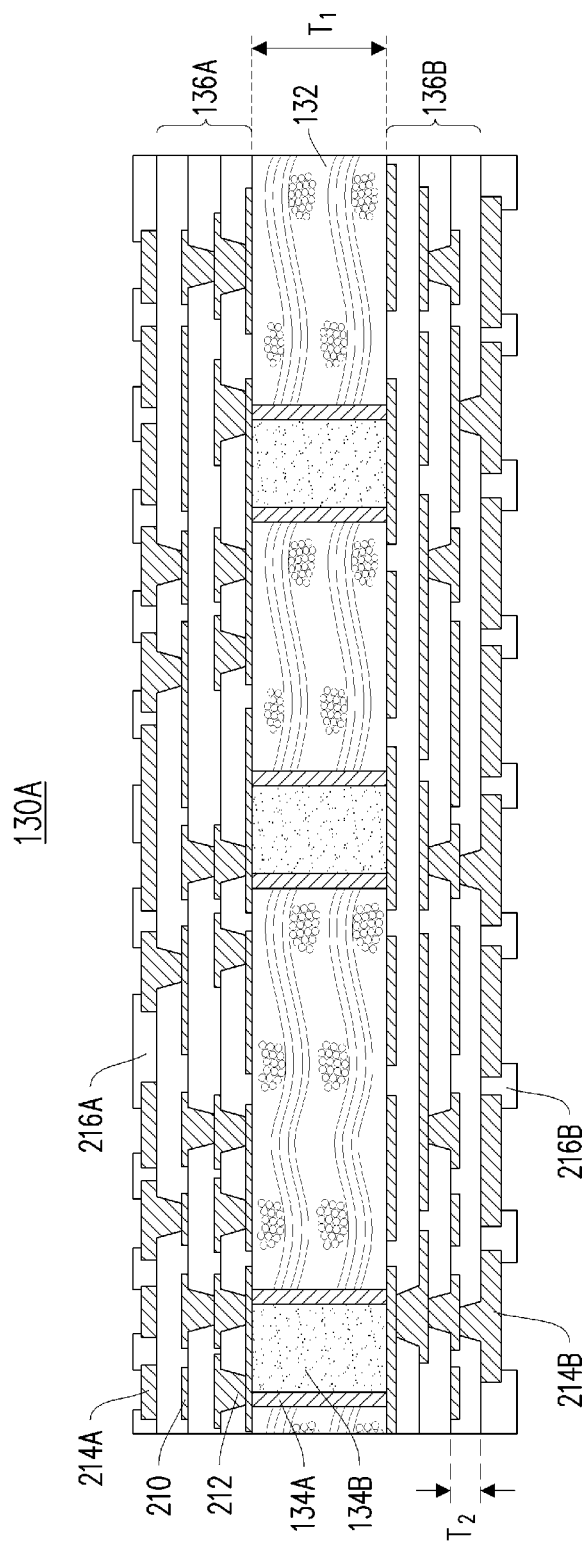
FIGS. 2 through 23B illustrate cross-sectional views of intermediate steps during a process for forming a package component in accordance with some embodiments.

In FIG. 2, an exemplary core substrate 130A of the plurality of core substrates 130 is illustrated, for simplification. The plurality of core substrates 130 may be, e.g., an organic substrate, a ceramic substrate, a silicon substrate, or the like, and a thickness $T_1$ between about 30 and about 2000 micrometers (μm).

In some embodiments the plurality of core substrates 130 may be processed to form redistribution structures 136 on the plurality of core substrates 130. For example, the exemplary core substrate 130A includes a core 132. The core 132 may be formed of one or more layers of glass fiber, resin, filler, pre-preg, epoxy, silica filler, ABF, polyimide, molding compound, other materials, and/or combinations thereof, having a thickness $T_2$ between about 5 and about 50 μm. In some embodiments, for example, two layers of material make up the core 132. The core 132 may be formed of organic and/or inorganic materials. In some embodiments, the core 132 includes one or more passive components (not shown) embedded inside. The core 132 may comprise other materials or components. Conductive vias 134 are formed extending through the core 132. The conductive vias 134 comprise a conductive material 134A such as copper, a copper alloy, or other conductors, and may include a barrier layer (not shown), liner (not shown), seed layer (not shown), and/or a fill material 134B, in some embodiments. The conductive vias 134 provide vertical electrical connections from one side of the core 132 to the other side of the core 132. For example, some of the conductive vias 134 are coupled between conductive features at one side of the core 132 and conductive features at an opposite side of the core 132. Holes for the conductive vias 134 may be formed using a drilling process, photolithography, a laser process, or other methods, as examples, and the holes of the conductive vias 134 are then filled or plated with conductive material. In some embodiments, the conductive vias 134 are hollow conductive through vias having centers that are filled with an insulating material. Redistribution structures 136A and 136B are formed on opposing sides of the core 132. The redistribution structures 136A and 136B are electrically coupled by the conductive vias 134, and fan-in/fan-out electrical signals.

The redistribution structures 136A and 136B each include dielectric layers, formed of ABF, pre-preg, molding film, or the like, and metallization patterns. Each respective metallization pattern has line portions 210 on and extending along a major surface of a respective dielectric layer, and has via portions 212 extending through the respective dielectric layer. Solder resists 216A and 216B and under-bump metallurgies (UBMs) 214A and 214B may be formed on the redistribution structures 136A and 136B, respectively. The redistribution structure 136A is attached to the redistribution structure 120 by the UBMs 214A through the conductive connectors 180 (as shown in FIG. 1). More or fewer dielectric layers and metallization patterns may be formed in the redistribution structures 136A and 136B than shown in FIG. 2.

The plurality of core substrates 130 may include active and passive devices (not shown), or may be free from either active devices, passive devices, or both. A wide variety of devices such as transistors, capacitors, resistors, combinations of these, and the like may be used. The devices may be formed using any suitable methods.

In some embodiments, the plurality of core substrates 130 comprises between 2 and 10 complete layers of material. For example, in the embodiment shown, the exemplary core substrate 130A includes 3 top redistribution layers in redistribution structure 136B, one or more layers of substrate material in core 132, and 3 bottom redistribution layers in redistribution structure 136A. In other embodiments, the plurality of core substrates may include more or fewer redistribution layers on either side, or both sides, of the core 132.

Figure 3:
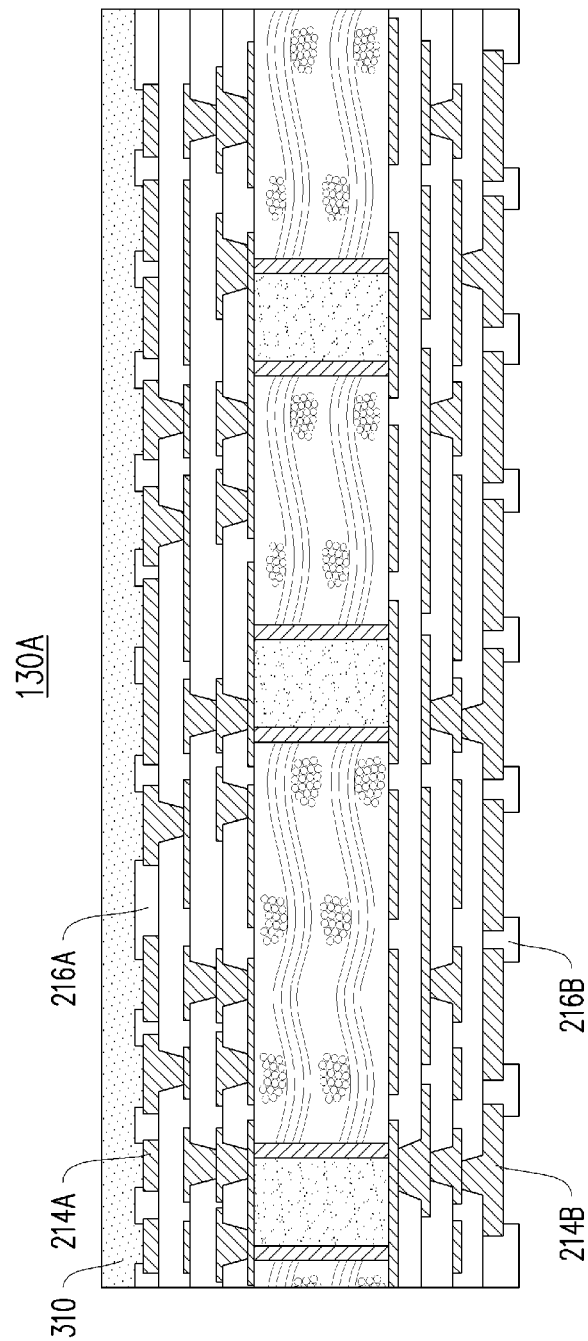

In FIG. 3, a first mask layer 310 is formed on one side of the exemplary core substrate 130A, opposite from where the Cu posts will be formed, to protect top UBMs 214A and solder resists 216A during subsequent core substrate processing steps. In some embodiments, the first mask layer 310 may comprise a photoresist formed by lamination, or the like, and may be exposed to light for patterning.

Figure 4:
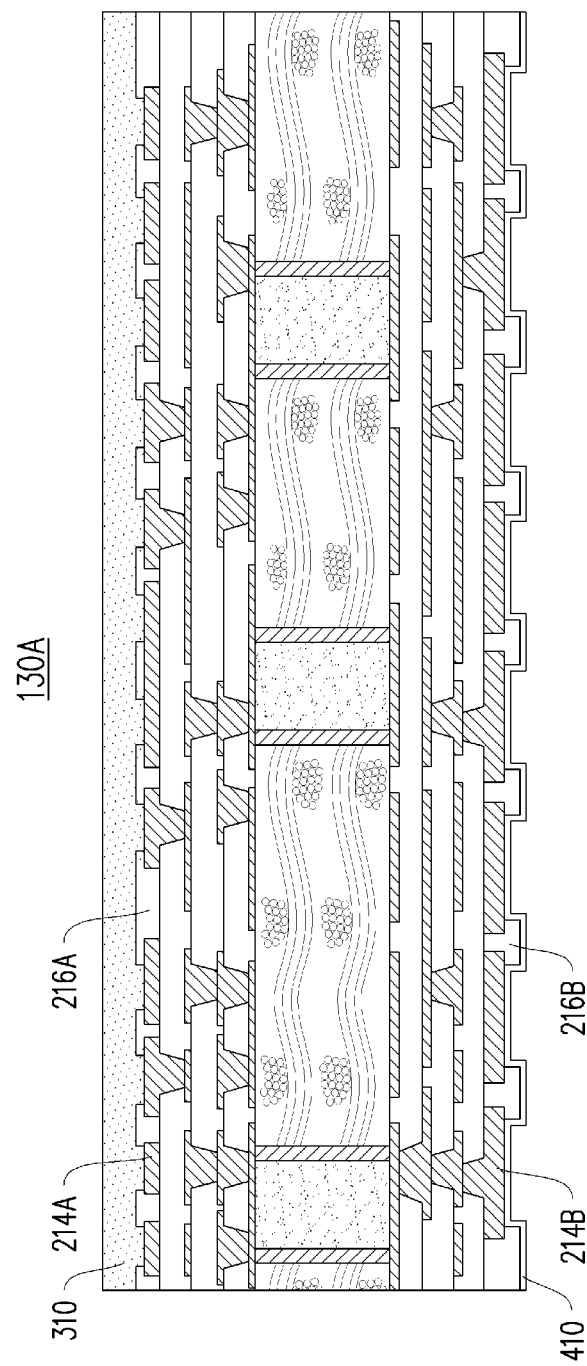

In FIG. 4, a seed layer 410 is formed over the bottom UBMs 214B and solder resists 216B. In some embodiments, the seed layer is a metal layer, which may be a single layer or a composite layer comprising a plurality of sub-layers formed of different materials. The seed layer may be, for example, a titanium layer and a copper layer over the titanium layer. The seed layer may be formed using, for example, electrodeless plating, sputtering, or the like.

Figure 5:
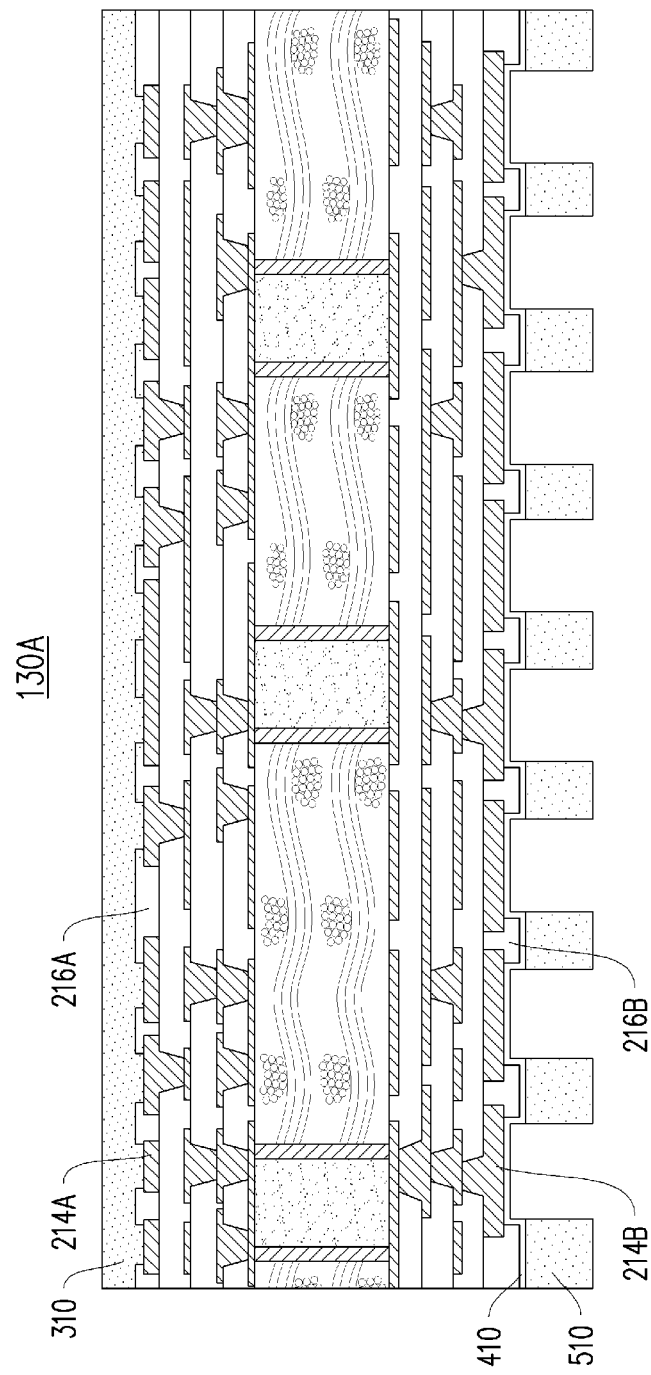

In FIG. 5, a second mask layer 510 is then formed and patterned on the seed layer 410. The second mask layer 510 may comprise a photoresist formed by lamination, or the like, and may be exposed to light for patterning. The patterning forms openings through the photoresist to expose the seed layer 410, where the openings in the photoresist correspond to the bottom UBMs 214B.

Figure 6:
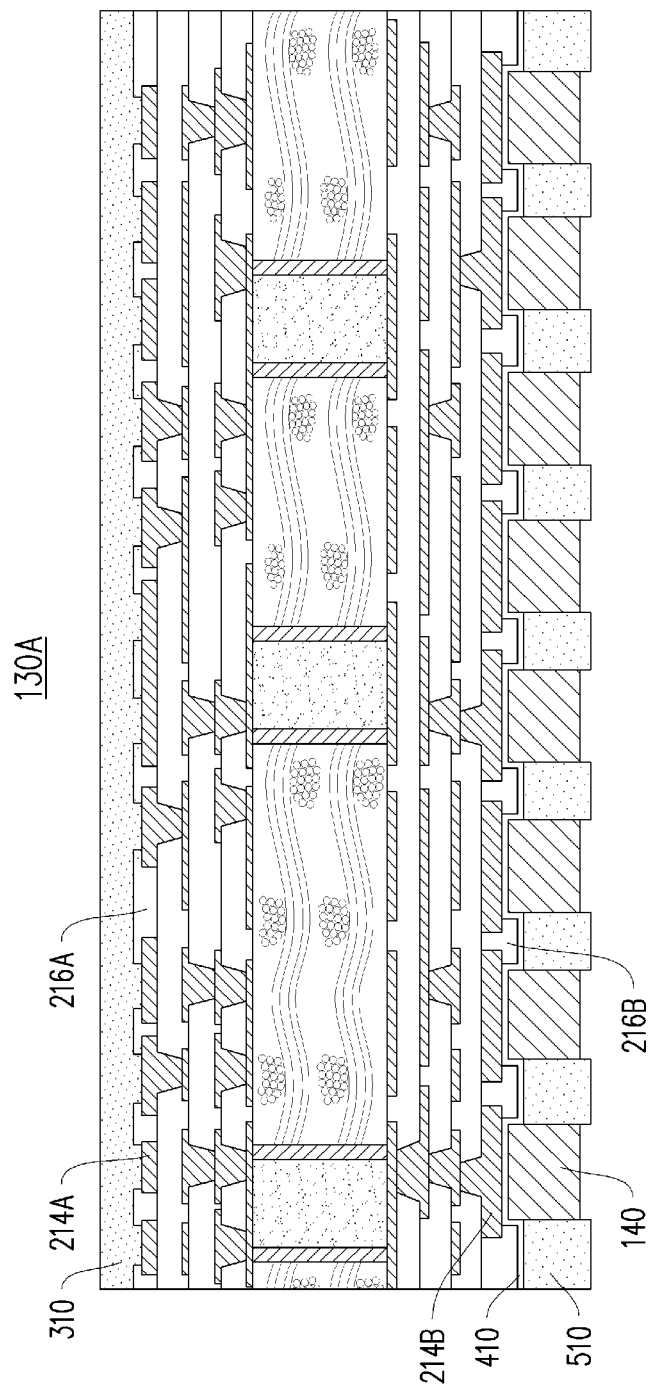

In FIG. 6, conductive posts 140 are then formed in the openings of the photoresist and on the exposed portions of the seed layer. The conductive posts 140 may be formed by plating, such as electroplating or electroless plating, or the like. In some embodiments, the conductive post 140 may comprise metal, like copper, titanium, tungsten, aluminum, combinations thereof, or the like. The combination of the conductive post 140 and underlying portions of the seed layer 410 form the conductive lines through which signals and power is routed to and through the exemplary core substrate 130A.

Figure 7:
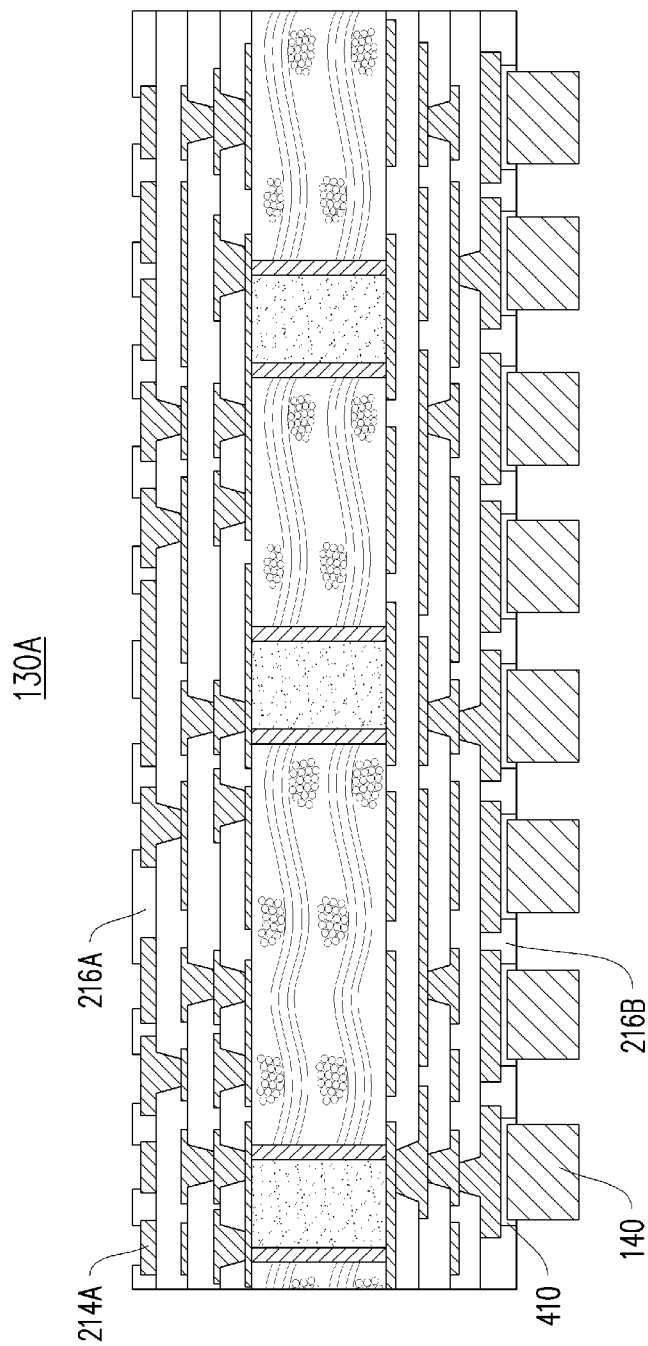

In FIG. 7, the first mask layer 310, second mask layer 510, and portions of the seed layer on which the conductive posts 140 are not formed are removed. In embodiments in which the first mask layer 310 and the second mask layer 510 are formed of a photoresist, the first mask layer 310 and the second mask layer 510 may be removed by an acceptable ashing or stripping process, such as using an oxygen plasma or the like. Once the photoresist is removed, exposed portions of the seed layer, such as those areas that existed across the bottom (as shown) solder resist 216B, are removed, such as by using an acceptable etching process, such as by wet or dry etching.

Figure 8:
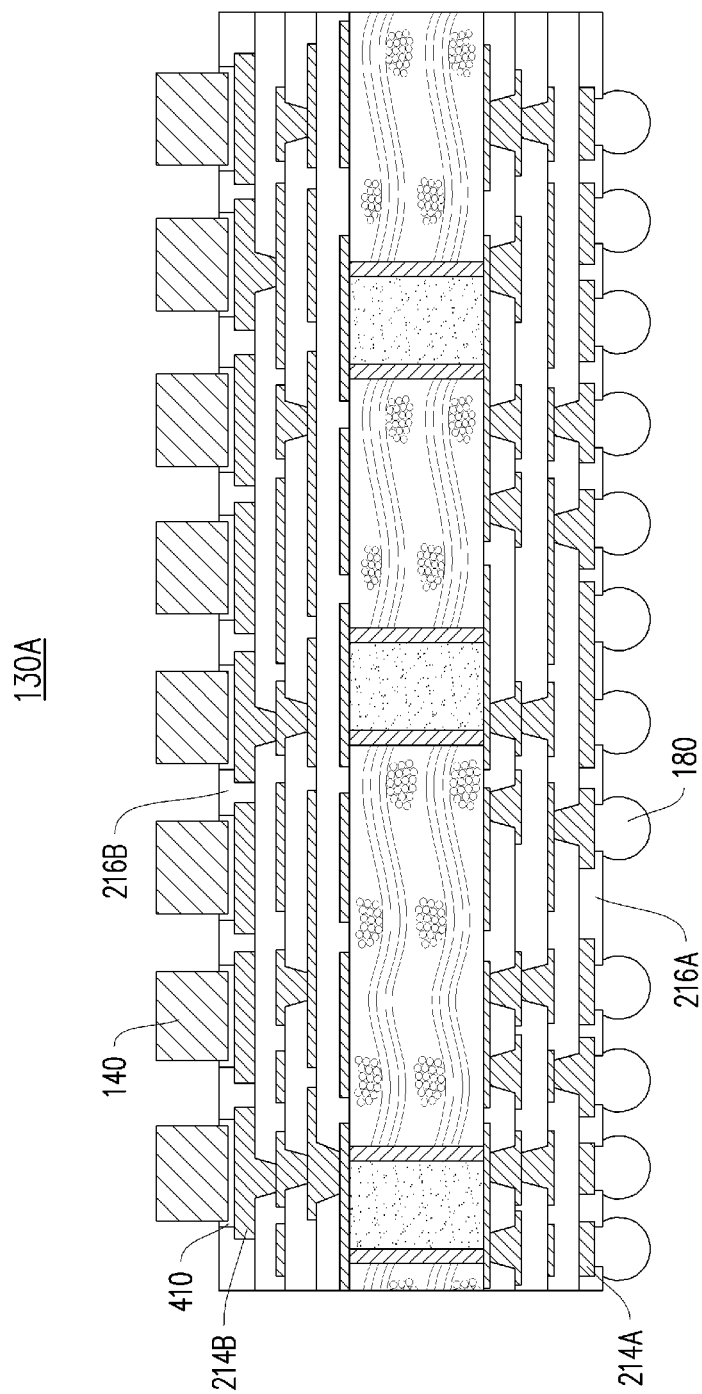

In FIG. 8, conductive connectors 180 are formed that will be used to attach the plurality of core substrates 130 to the redistribution structure 120 (as shown in FIG. 1). The conductive connectors 180 may be first formed on either the plurality of core substrates 130 or the redistribution structure 120, and then reflowed to complete the bond. For example, in the embodiment shown in FIG. 8, conductive connectors 180 are formed on UBMs 214A of the exemplary core substrate 130A with a pitch between 150 μm and 1000 μm. The conductive connectors 180 may be ball grid array (BGA) connectors, solder balls, metal pillars, controlled collapse chip connection ($C_4$) bumps, micro bumps, electroless nickel-electroless palladium-immersion gold technique (ENEPIG) formed bumps, or the like. The conductive connectors 180 may include a conductive material such as solder, copper, aluminum, gold, nickel, silver, palladium, tin, the like, or a combination thereof. In some embodiments, the conductive connectors 180 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 180 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

FIGS. 9 through 13 illustrates various intermediate stages in fabricating a redistribution structure 120 (see FIG. 1), in accordance with some embodiments. The illustrations of the individual features have been simplified in FIGS. 9-13 for ease of illustration.

Figure 9:
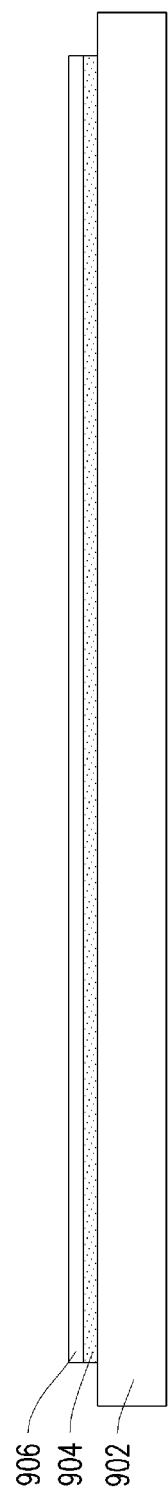

Referring first to FIG. 9, a carrier substrate 902 is provided, a release layer 904 is formed on the carrier substrate 902, and a protective layer 906 is formed over the release layer 904. The carrier substrate 902 may be a glass carrier substrate, a ceramic carrier substrate, or the like. The carrier substrate 902 may be a wafer, such that multiple redistribution structures can be formed on the carrier substrate 902 simultaneously.

The release layer 904 may be formed of a polymer-based material, which may be removed along with the carrier substrate 902 from the overlying structures that will be formed in subsequent steps. In some embodiments, the release layer 904 is an epoxy-based thermal-release material, which loses its adhesive property when heated, such as a light-to-heat-conversion (LTHC) release coating. In other embodiments, the release layer 904 may be an ultra-violet (UV) glue, which loses its adhesive property when exposed to UV lights. The release layer 904 may be dispensed as a liquid and cured, may be a laminate film laminated onto the carrier substrate 902, or may be the like. The top surface of the release layer 904 may be leveled and be substantially planar within process variations.

The protective layer 906 is deposited to provide physical protection of the features of subsequently formed layers once the carrier substrate is de-bonded, as described further below. Additionally, the protective layer 906 may provide electrical isolation and environmental protection. The protective layer 906 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The protective layer 906 may be formed, for example, by spin coating, lamination, chemical vapor deposition (CVD), or the like. The protective layer 906 may have an upper surface that is substantially level within process variations.

Figure 10:
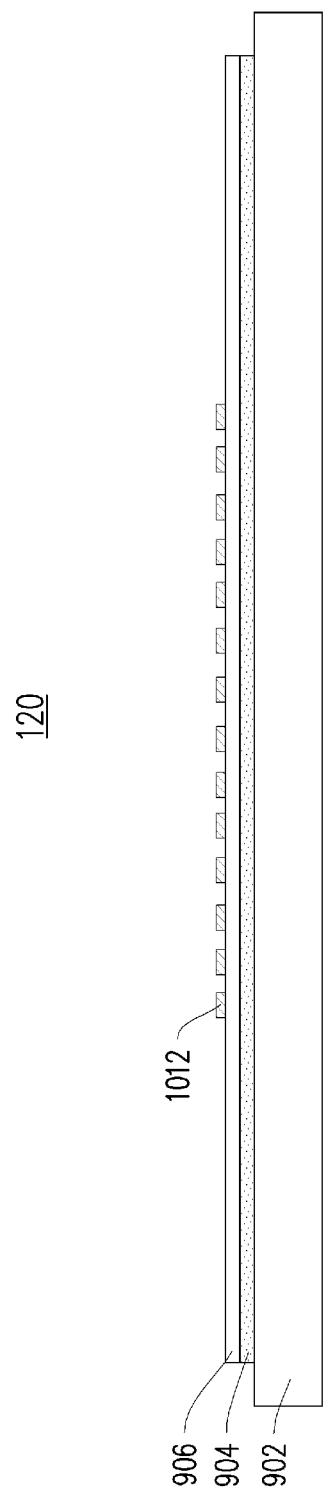

In FIG. 10, conductive lines 1012 are formed on the protective layer 906. As an example to form the conductive lines 1012, a seed layer (not shown) is formed over the protective layer 906. In some embodiments, the seed layer is a metal layer, which may be a single layer or a composite layer comprising a plurality of sub-layers formed of different materials. The seed layer may be, for example, a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The patterning forms openings through the photoresist to expose the seed layer, where the openings in the photoresist correspond to the conductive lines 1012. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive lines 1012. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 11:
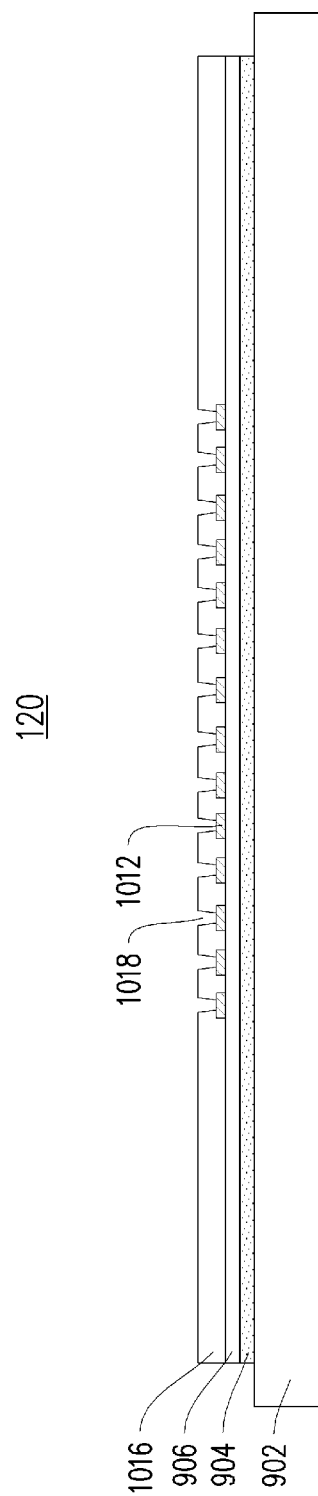

In FIG. 11, the dielectric layer 1016 may be formed on the conductive lines 1012 and the protective layer 906. In some embodiments, the dielectric layer 1016 is an encapsulant, such as a pre-preg, resin coated copper (RCC), molding compound, molding film, polyimide, photo-imageable dielectric (PID), epoxy, or the like, and may be applied by compression molding, transfer molding, lamination, coating, or the like. The encapsulant may be applied in liquid or semi-liquid form and then subsequently cured. In some embodiments, the dielectric layer 1016 may be formed by spin coating, lamination, CVD, the like, or a combination thereof. In other embodiments, the dielectric layer 1016 is formed of a polymer, which may be a photo-sensitive material such as PBO, BCB, or the like, that may be patterned using a lithography mask. In other embodiments, the dielectric layer 1016 is formed of a nitride such as silicon nitride; an oxide such as silicon oxide, PSG, BSG, BPSG; or the like. The dielectric layer 1016 is then patterned to form openings 1018 exposing portions of the conductive lines 1012. The patterning may be formed by an acceptable process, such as by exposing the dielectric layer 1016 to light when the dielectric layer 1016 is a photo-sensitive material or by etching using, for example, an anisotropic etch. If the dielectric layer 1016 is a photo-sensitive material, the dielectric layer 1016 can be developed after the exposure.

Figure 12:
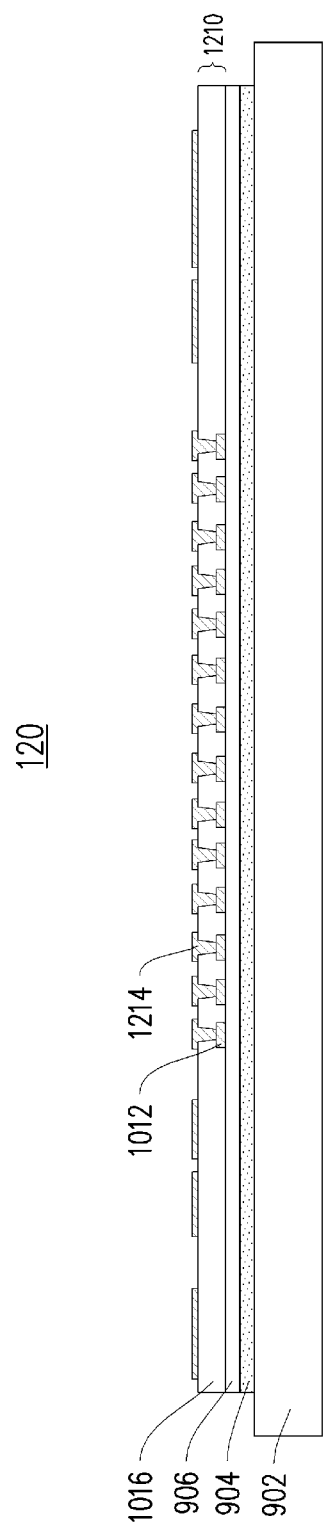

In FIG. 12, the metallization pattern 1214 is formed over dielectric layer 1016 and exposed portions of conductive lines 1012. The metallization pattern 1214 includes conductive elements extending along the major surface of the dielectric layer 1016 and extending through the dielectric layer 1016 to physically and electrically couple to an underlying conductive layer, e.g., the conductive lines 1012 in this illustrated embodiment. As an example to form the metallization pattern 1214, a seed layer is formed over the dielectric layer 1016 and in the openings extending through the dielectric layer 1016 to conductive lines 1012. In some embodiments, the seed layer (not shown) is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light and developed for patterning. The patterning forms openings through the photoresist to expose the seed layer, with the pattern of the openings corresponding to the metallization pattern 1214. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 1214. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The combination of the dielectric layer 1016 and the metallization pattern 1214 form the redistribution layer 1210.

Figure 13:
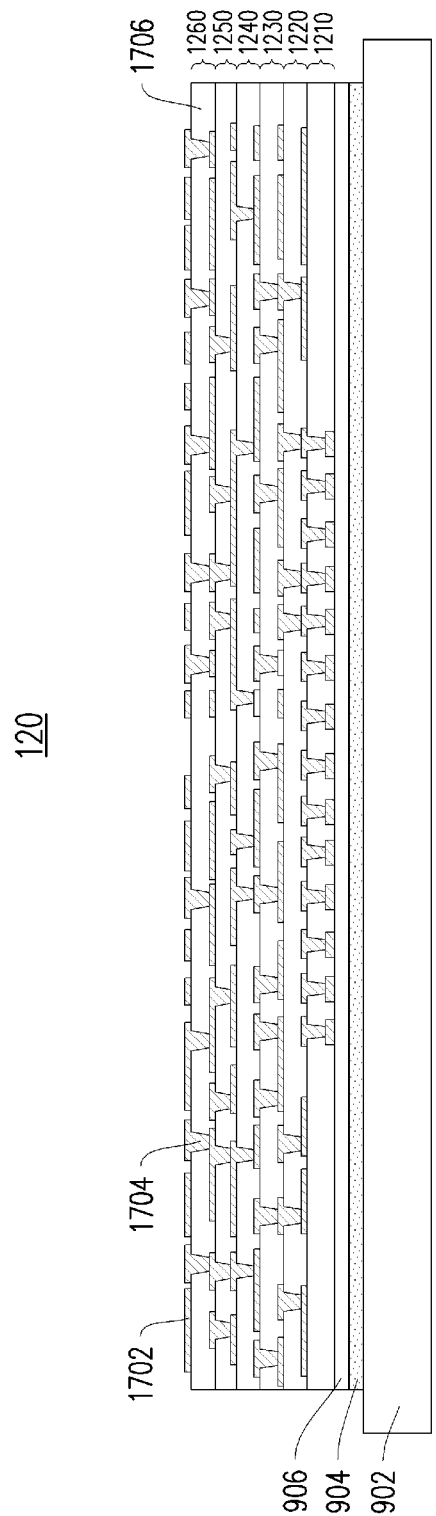

In FIG. 13, the steps and process discussed above are repeated to form additionally shown redistribution layers 1220, 1230, 1240, 1250, and 1260. In some embodiments, the process described above to form the redistribution layer 1210 may be repeated one or more times to provide additional routing layers as desired for a particular design, wherein metallization patterns 1214 (see FIG. 12) of the redistribution layer 1210 may include routing lines or redistribution lines. Six redistribution layers 1210, 1220, 1230, 1240, 1250, and 1260 are shown for illustrative purposes. In some embodiments more than six layers or fewer layers than six may be used. The metallization patterns for each redistribution layer 1210, 1220, 1230, 1240, 1250, and 1260 may each be a single pattern having line and via portions (as shown), or may have separately formed conductive lines and conductive vias.

The above description is one example of forming the redistribution layers of the redistribution structure. In other embodiments, conductive vias may be formed on and extending from the conductive lines. As an example to form such conductive vias, a photoresist is formed and patterned over the dielectric layer and the conductive lines to form openings through the photoresist to expose portions of the underlying conductive lines such that the openings in the photoresist correspond to the pattern of the conductive vias to be formed. A conductive material is then formed in the openings on the exposed portions of the exposed conductive lines and the photoresist may be removed.

A dielectric layer may then be formed on and around the conductive lines and the conductive vias in accordance with some embodiments. After formation, the dielectric layer surrounds the conductive vias and conductive lines. In some embodiments, the dielectric layer is an encapsulant, such as a pre-preg, resin coated copper (RCC), molding compound, polyimide, photo-imageable dielectric (PID), epoxy, or the like, and may be applied by compression molding, transfer molding, lamination, coating, or the like. The encapsulant may be applied in liquid or semi-liquid form and then subsequently cured. In some embodiments, the dielectric layer is formed over the carrier substrate such that the conductive lines and conductive vias are buried or covered, and a planarization process is then performed on the dielectric layer to expose the conductive vias. The topmost surfaces of the dielectric layer and conductive vias are then substantially level (e.g., planar) within process variations after the planarization process. The planarization process may be, for example, a chemical-mechanical polish (CMP). In some embodiments, the dielectric layer may comprise other materials, such as silicon oxide, silicon nitride, or the like.

In further embodiments, conductive lines may be formed on the dielectric layer and exposed portions of the conductive vias. As an example to form the conductive lines, a seed layer may be formed over the dielectric layer and exposed portions of the conductive vias. A photoresist is then formed and patterned on the seed layer to form opening corresponding to the desired positioning of the conductive lines to be formed. A conductive material is then formed in the openings on the exposed portions of the seed layer. The combination of the conductive material and underlying portions of the seed layer form the conductive lines. The photoresist and portions of the seed layer on which the conductive material is not formed are removed.

The redistribution structure 120 is shown as an example having six redistribution layers. More or fewer layers may be formed in the redistribution structure 120. If fewer layers are to be formed, steps and process discussed above may be omitted. If more layers are to be formed, steps and processes discussed above may be repeated. In some embodiments, the redistribution structure 120 includes between 1 and 20 layers.

Figure 14:
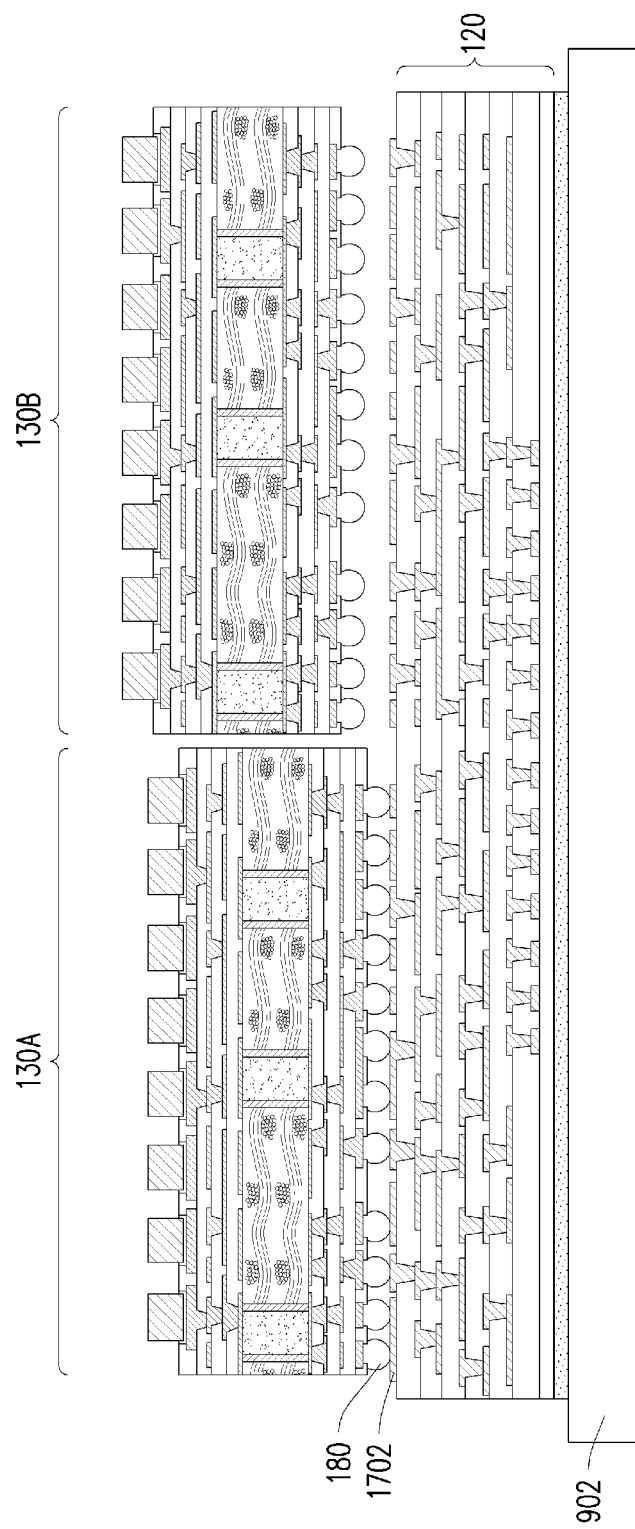

In FIG. 14, in some embodiments, the plurality of core substrates 130, in this case showing two exemplary core substrates 130A and 130B, may be placed on the redistribution structure 120 using a pick and place process or another suitable process.

Figure 15:
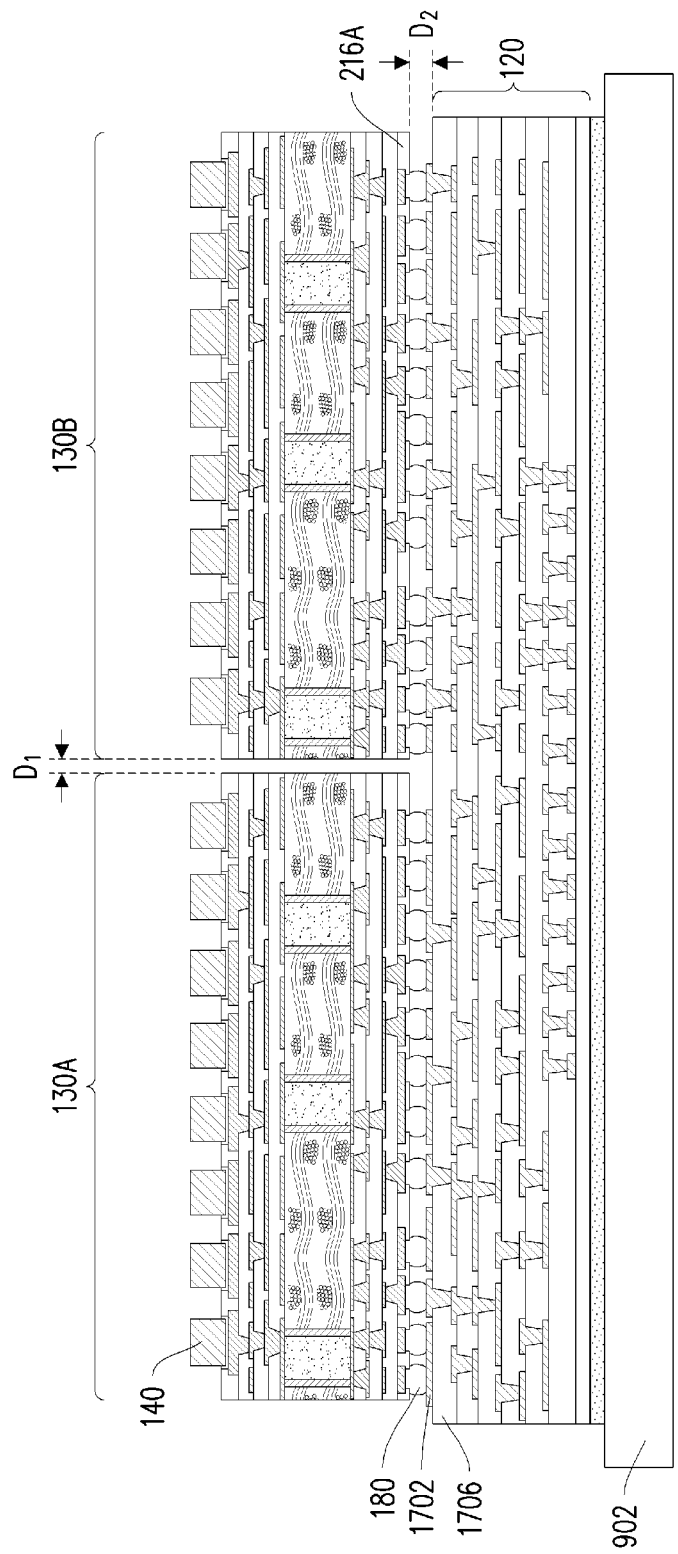

As showing in FIG. 15, and the conductive connectors 180 are bonded by flip chip bonding process or other suitable bonding process. In some embodiments, the conductive connectors 180 are reflowed to attach the plurality of core substrates 130A and 130B to the redistribution structure 120 by way of conductive lines 1702. The conductive connectors 180 electrically and/or physically couple the plurality of core substrates 130 to the redistribution structure 120.

The conductive connectors 180 may have an epoxy flux (not shown) formed thereon before they are reflowed with at least some of the epoxy portion of the epoxy flux remaining after the plurality of core substrates 130 are attached to the redistribution structure 120.

In some embodiments, the plurality of core substrates 130 are separated from each adjacent core substrate by a distance $D_1$ between about 40 μm and about 500 μm. In some embodiments, a standoff height $D_2$, for example, the between the top surface of dielectric layer 1706 and the bottom of the solder resist 216A on the core substrate 130B, of 50 μm to 500 μm is utilized between the plurality of core substrates 130 and the redistribution structure 120. These distances provide adequate space between the plurality of core substrates 130 themselves, and between the plurality of core substrates 130 and the redistribution structure 120, to allow molding film to flow between and under the two or more core substrates in subsequent processing steps.

Figure 16A:
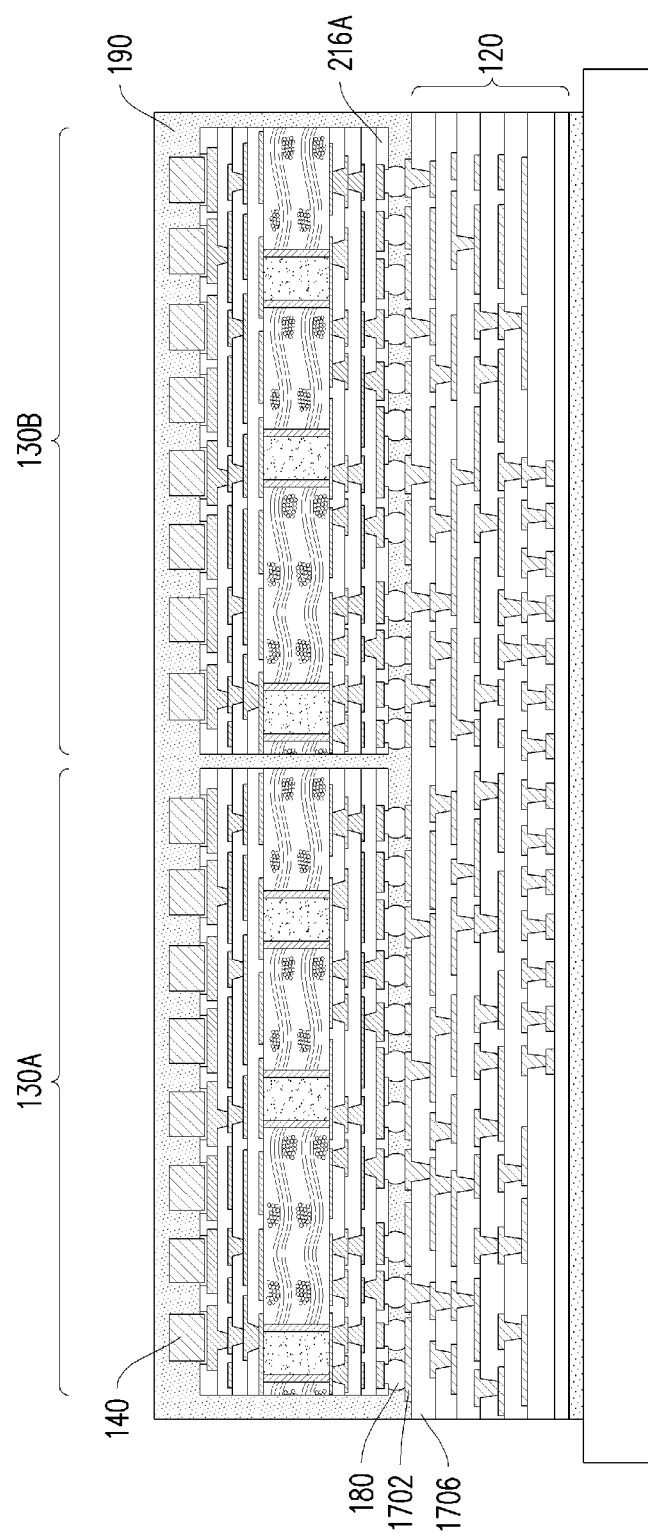

In FIG. 16A, an encapsulant 190 is formed on and around the various components. After formation, the encapsulant 190 surrounds the plurality of core substrates 130, including conductive connectors 180, conductive lines 1702, and the upper exposed surface of dielectric layer 1706. The encapsulant 190 may be formed of a molding compound, epoxy, or the like, and may be applied by compression molding, transfer molding, or the like. The encapsulant 190 may be applied in liquid or semi-liquid form and then subsequently cured. The encapsulant 190 may be formed over the carrier substrate 902 such that the plurality of core substrates 130 are buried or covered.

Figure 16B:
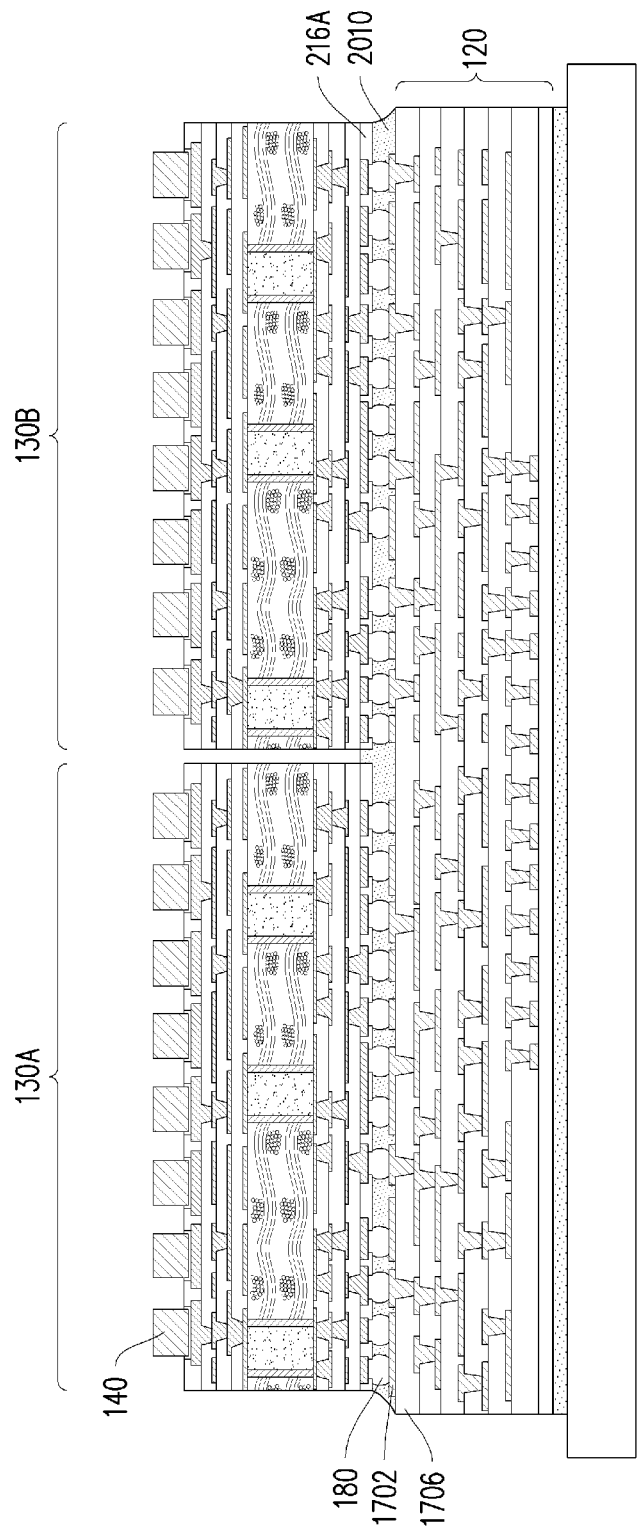
Figure 16C:
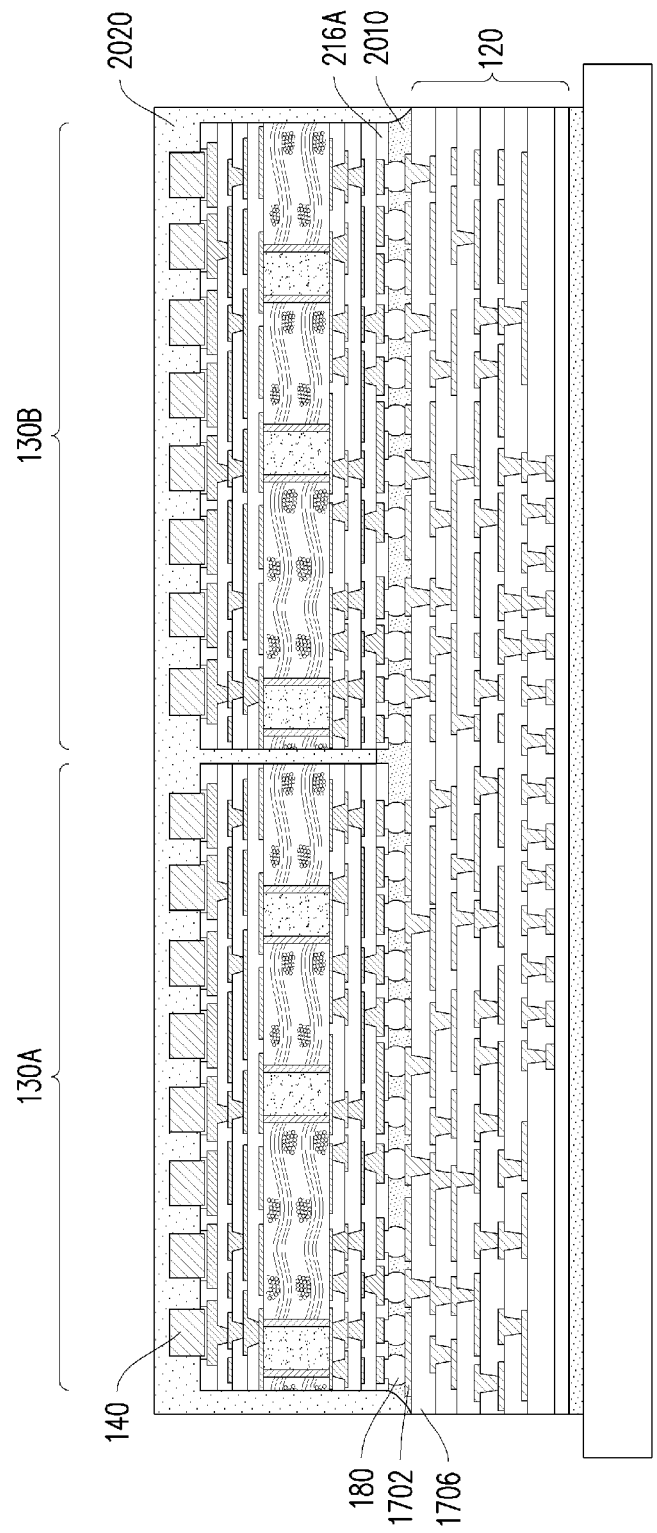

In other embodiments, such as shown in FIGS. 16B and 16C, a first under fill is performed by forming underfill 2010 between the plurality of core substrates 130 and the redistribution structure 120 and around the various components. After formation, the underfill 2010 surrounds the bottom (as shown in FIG. 20B) solder resist 216A of the plurality of core substrates 130, including conductive connectors 180, conductive lines 1702, and the upper exposed surface of dielectric layer 1706. The underfill 2010 may be formed of a molding compound, epoxy, or the like, and may be applied by injection molding, or the like. The underfill encapsulant 2010 may be applied in liquid or semi-liquid form and then subsequently cured.

Subsequently, as shown in FIG. 16C, an encapsulant 2020 is formed on and around the various components. After formation, the encapsulant 2020 surrounds the plurality of core substrates 130, and the underfill 2010. The encapsulant 2020 may be formed of a molding compound, epoxy, or the like, and may be applied by compression molding, transfer molding, or the like. The encapsulant 2020 may be applied in liquid or semi-liquid form and then subsequently cured. The overmolding encapsulant 2020 may be formed over the carrier substrate 902 such that the plurality of core substrates 130 are buried or covered.

Figure 17:
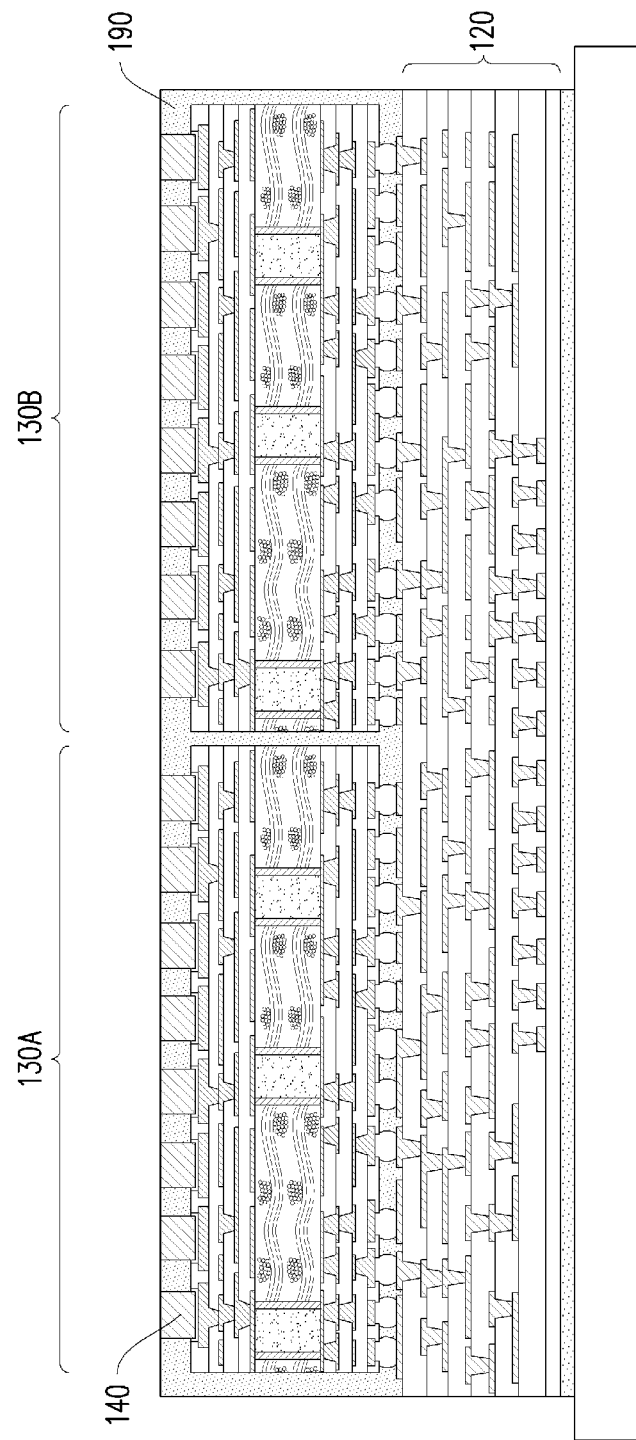

In FIG. 17, a planarization process may be performed, on the encapsulant 190 to expose the conductive posts 140 of the plurality of core substrates 130. Topmost surfaces of the encapsulant 190 and conductive posts 140 are substantially level (e.g., planar) after the planarization process within process variations. The planarization process may be, for example, a chemical-mechanical polish (CMP), a grinding process, or the like. In some embodiments, the planarization may be omitted, for example, if the conductive posts 140 are already exposed. Other processes may be used to achieve a similar result.

Figure 18A:
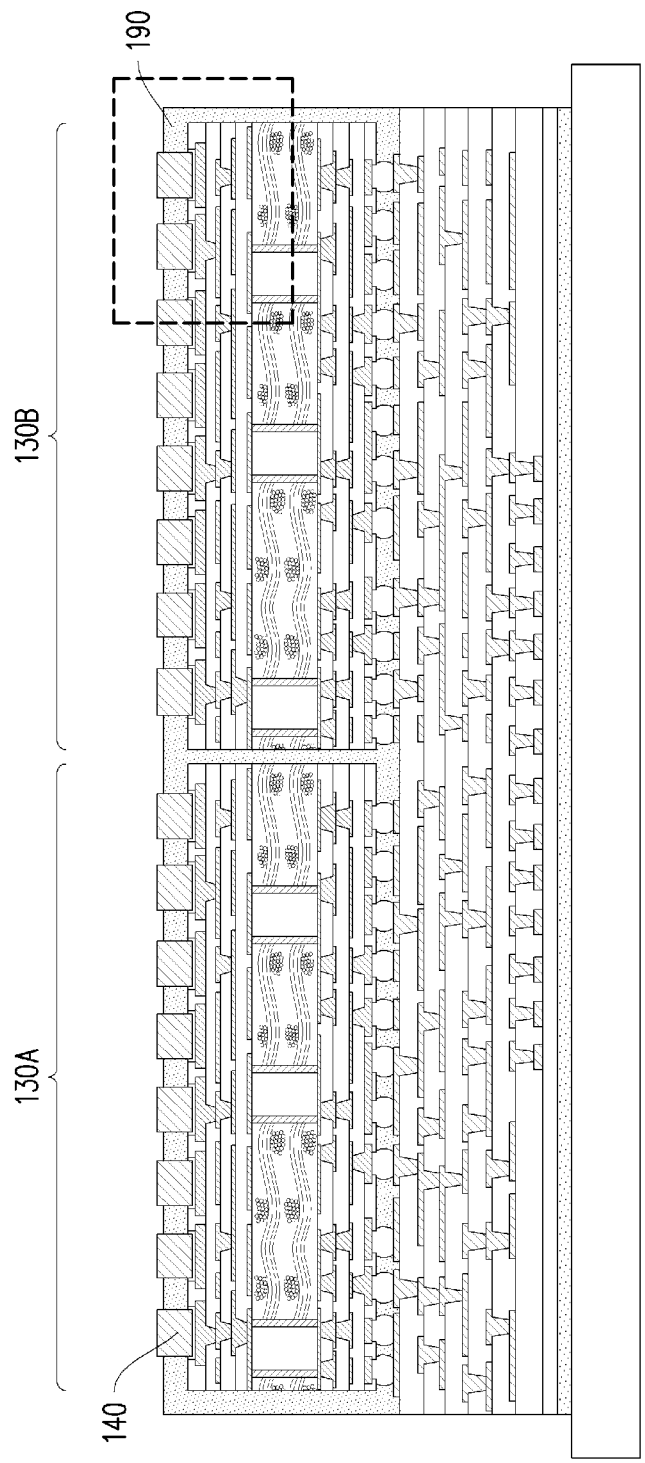
Figure 18B:
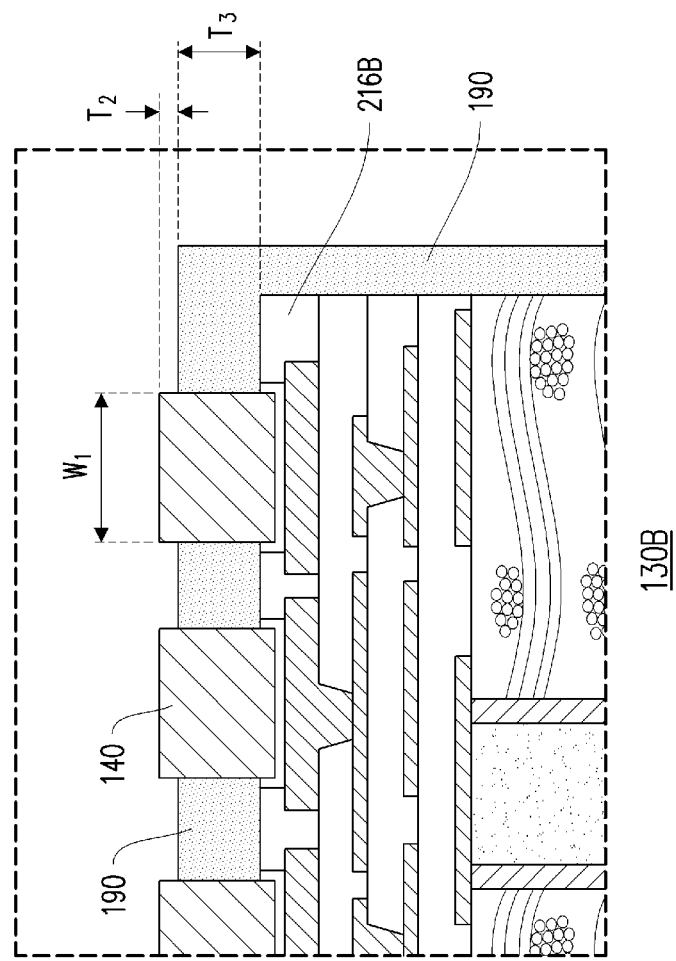

As shown in FIGS. 18A and 18B, the encapsulant 190 is recessed to expose sidewalls of the conductive posts 140 from the encapsulant 190. FIG. 18B is an enlarged section of FIG. 18A as bounded by the dotted line box in FIG. 18A. In some embodiments, the encapsulant is recessed such that a thickness $T_2$ between 1 μm and 50 μm of the conductive post 140 sidewall is exposed above the encapsulant 190. In some embodiments, a thickness $T_3$ between about 5 μm and about 100 μm of the encapsulant 190 remains along sidewalls of the conductive posts 140. Additionally, in some embodiments, a width $W_1$ of the conductive posts 140 is between about 300 μm and about 700 μm with a 1 millimeter BGA pitch. The BGA pitch may be between about 0.6 and about 1.0 mm some embodiments. Recessing of the encapsulant may be performed using, for example, a wet etch, a plasma etch process, or other suitable method.

Figure 19:
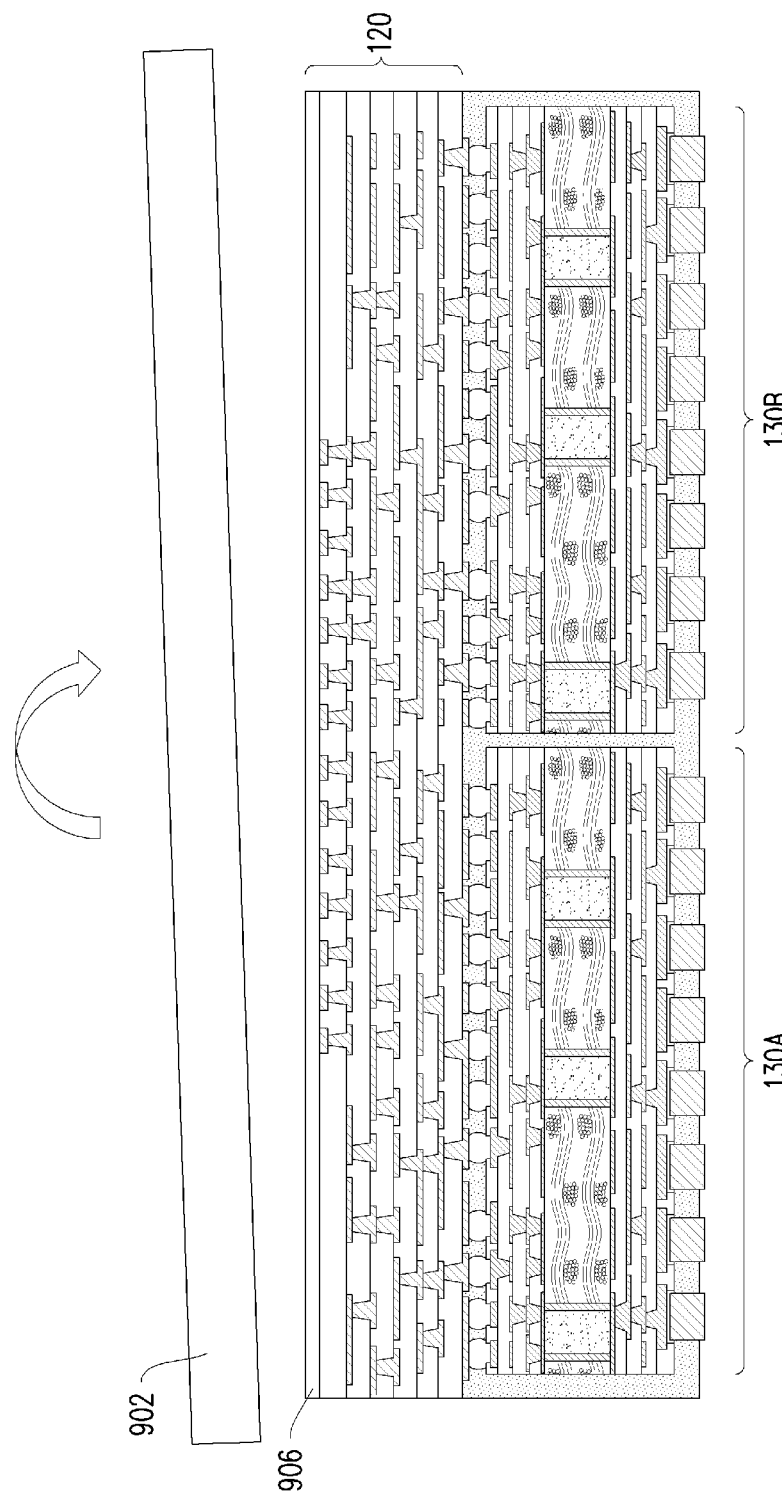

In FIG. 19, a carrier substrate de-bonding is performed to detach (or "de-bond") the carrier substrate 902 from the resulting build-up of the previously described steps comprising the plurality of core substrates 130 and the redistribution structure 120, among other structures. In accordance with some embodiments, the de-bonding includes projecting a light such as a laser light or an UV light on the release layer 904 (see FIG. 18A) so that the release layer 904 decomposes under the heat of the light and the carrier substrate 902 can be removed.

Figure 20:
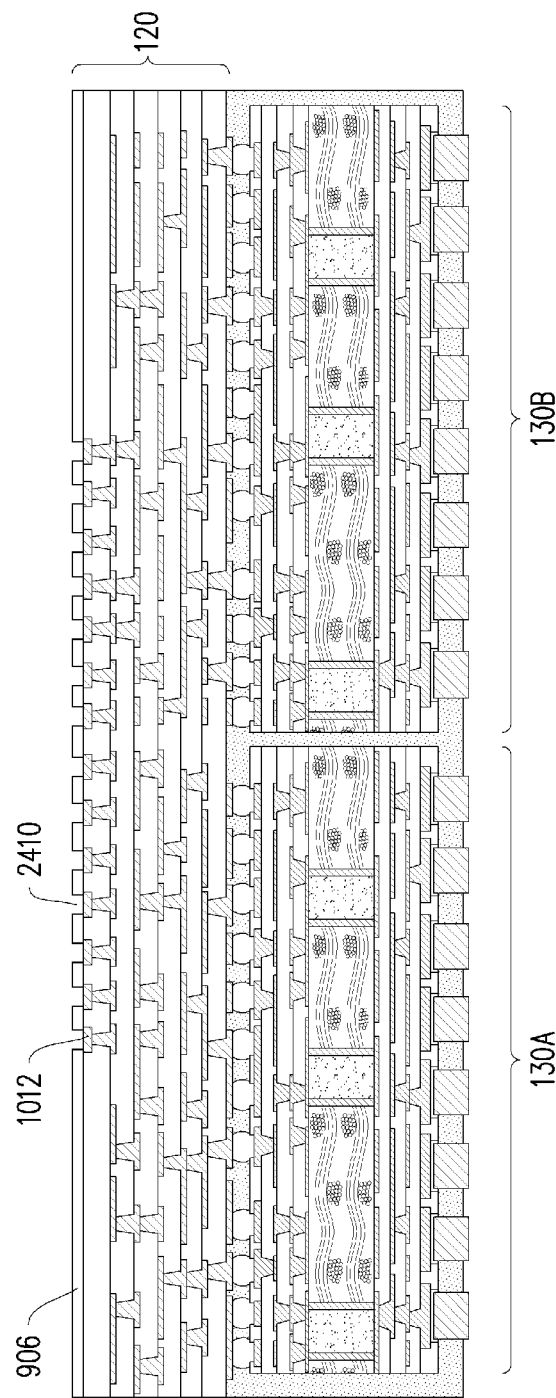

In FIG. 20 openings 2410 are formed in the protective layer 906 of the redistribution structure 120, exposing the conductive lines 1012. The openings 2410 may be formed by etching, a drilling process such as laser drilling, mechanical drilling, or the like. The patterning forms openings exposing portions of the conductive lines 1012. The patterning may be by an acceptable process, such as by exposing and developing the protective layer 906 to light when the protective layer 906 is a photosensitive material or by etching using, for example, an anisotropic etch when using a non photosensitive material such as silicon oxide, silicon nitride, or the like.

Conductive connectors 170 may be used to bond the redistribution structure 120 to an integrated circuit package no (see FIG. 22) and may be first formed on either the integrated circuit package 110 or the redistribution structure 120, and then reflowed to complete the bond. For example, in the embodiment shown in FIG. 21, conductive connectors 170 are first formed in the openings 2410 (see FIG. 20) coupled to the exposed conductive lines 1012. The conductive connectors 170 may be ball grid array (BGA) connectors, solder balls (as shown), metal pillars, controlled collapse chip connection (C4) bumps, micro bumps, electroless nickel-electroless palladium-immersion gold technique (ENEPIG) formed bumps, or the like. The conductive connectors 170 may include a conductive material such as solder, copper, aluminum, gold, nickel, silver, palladium, tin, the like, or a combination thereof. In some embodiments, the conductive connectors 170 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 170 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 22:
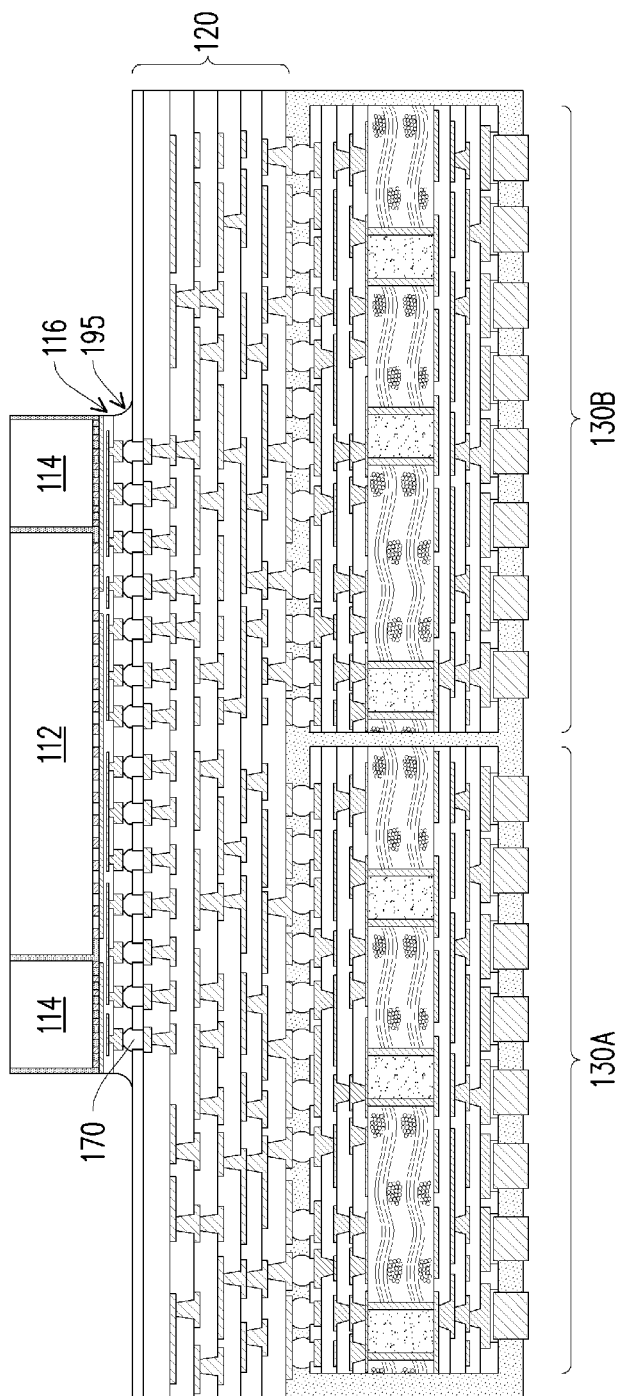

As shown in FIG. 22, the integrated circuit package no may be attached to the to the redistribution structure 120 through the conductive connectors 170. The conductive connectors 170 attach the integrated circuit package no to the conductive lines 1012 of the redistribution structure 120. Attaching the integrated circuit package no may include placing the integrated circuit package 110 on the conductive connectors 170 and reflowing the conductive connectors 170 to physically and electrically couple the integrated circuit package 110 and the redistribution structure 120. The integrated circuit package no may include a logic die 112 and one or more I/O dies 114 for interfacing with the logic die 112. The number, types, and arrangement of dies included in integrated circuit package is not limiting, and alternate dies and arrangements may be utilized in different embodiments. Multiple integrated circuit packages may be included by repeating the steps described above, in conjunction with the metallization to provide electrical connection to the multiple integrated circuits packages.

In some embodiments, an underfill 195 is formed surrounding the conductive connectors 170 and the integrated circuit package 110. The underfill 195 may reduce stress and protect the joints resulting from the reflowing of the conductive connectors 170. The underfill 195 may be formed by a capillary flow process after the integrated circuit package no is attached, or may be formed by a suitable deposition method. In some embodiments, a single layer of underfill 195 is formed beneath multiple adjacent devices, and further subsequent underfills (not shown) may be formed beneath and/or around additional devices placed on top of the redistribution structure 120.

Figure 23A:
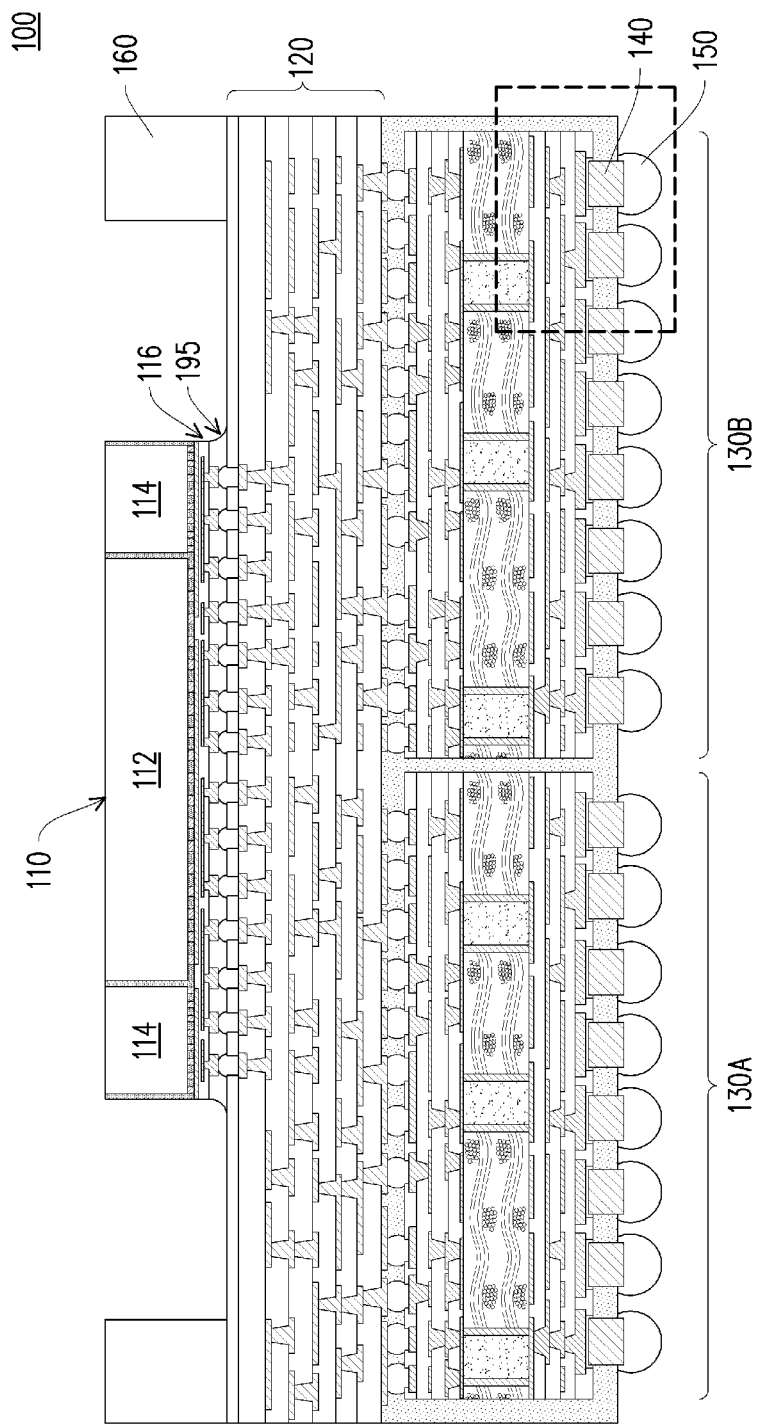

As shown in FIG. 23A, the external connectors 150 are then mounted to the conductive posts 140. The external connectors 150 may be BGA connectors (as shown), solder balls, metal pillars, controlled collapse chip connection (C4) bumps, micro bumps, or the like. The external connectors 150 may include a conductive material such as solder, copper, aluminum, gold, nickel, silver, palladium, tin, the like, or a combination thereof. In some embodiments, the external connectors 150 are formed by initially forming a layer of reflowable material on the conductive posts 140 through evaporation, electroplating, printing, solder transfer, ball placement, or the like. Once a layer of reflowable material has been formed on the conductive posts 140, a reflow may be performed in order to shape the material into the desired bump shapes.

Additionally, a protective ring 160 may be mounted to the top of the singulated package component 100, encircling the integrated circuit package 110. In some embodiments the protective ring may be added to provide additional rigidity to the singulated package component and protect the mounted integrated circuit package from physical bumping and knocks that may damage the electrical connection between the integrated circuit package 110 and the redistribution structure 120, or the integrated circuit package no itself.

Figure 23B:
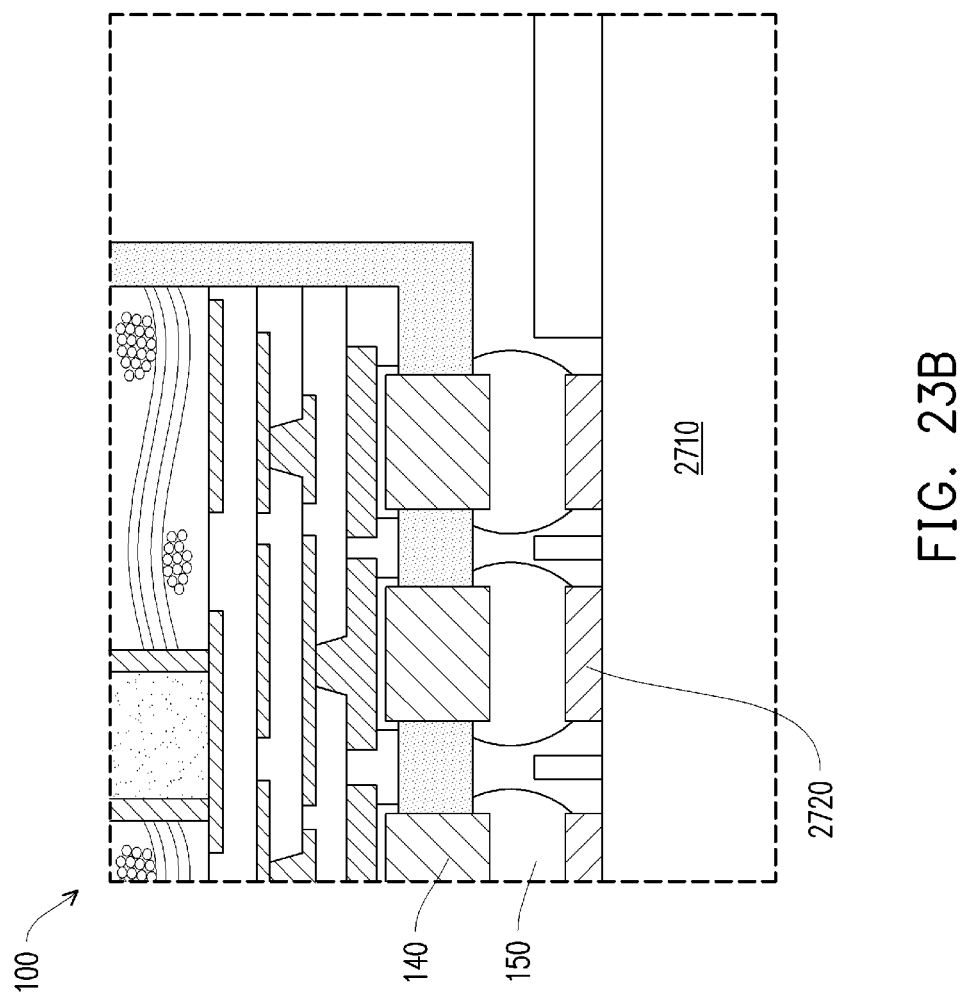

As shown in FIG. 23B, when the external connectors 150 are used to physically and electrically connect the singulated package component 100 to a printed circuit board (PCB) 2710, the external connectors 150 can encapsulate the face and a portion of the sidewall of the conductive posts 140 as well as the contacts 2720 of the PCB. Thus, the bonding strength and rigidity of the bond from the singulated package component 100 to the PCB 2710 is enhanced. This increases board level reliability for systems utilizing singulated package components 100 built using the described processes.

Figure 24:
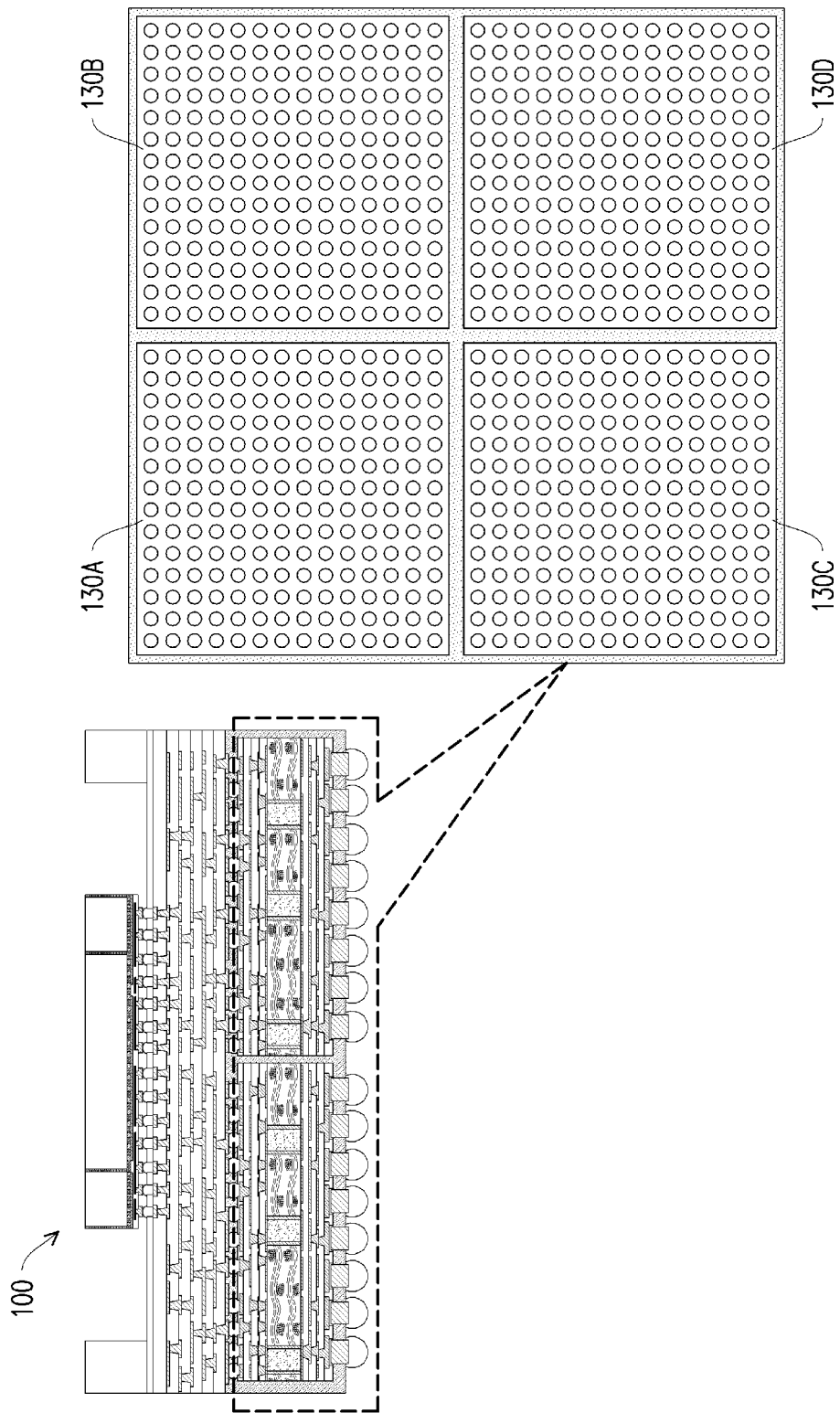
FIG. 24 illustrates a cross-sectional versus a planar view of the layout of multiple core substrates in a package component in accordance with some embodiments.

The plurality of core substrates 130 can be expanded in a two dimensional grid. For example, as shown in FIG. 24, the singulated package component 100 comprises four core substrates 130A, 130B, 130C, and 130D arranged in a 2×2 array. More or fewer core substrates may be included, to achieve larger or smaller singulated package components wo in varying shapes and sizes, while still achieving stable BGA ball coplanarity across a number of independent core substrates and core substrate warpage.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 21:
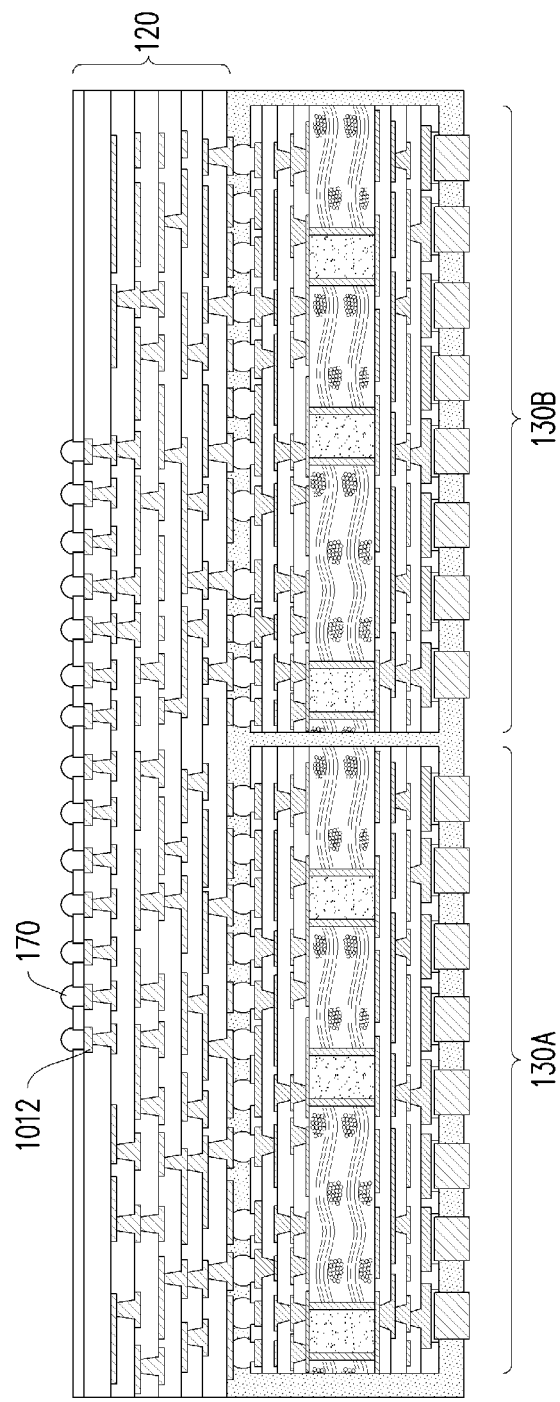
Figure 25:
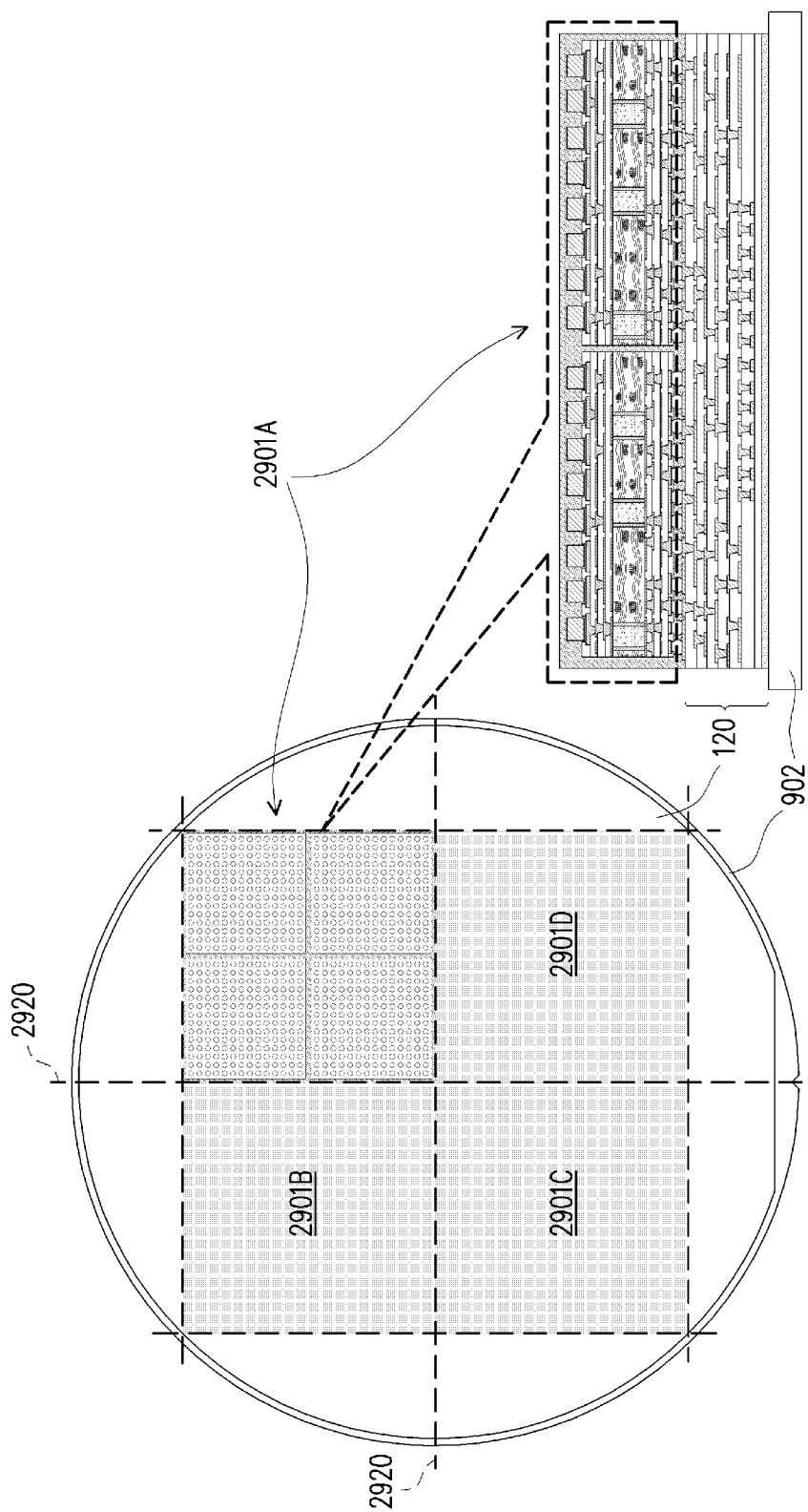
FIG. 25 illustrates a planar view of the layout of package regions on a wafer substrate in accordance with some embodiments.

Additionally, redistribution structure 120 may be larger and include multiple package regions that can later be singulated by cutting through scribe lines to produce multiple independent singulated package components from a single substrate. For example, FIG. 25 illustrates the redistribution structure 120 having a circular wafer shape with multiple package regions. In the embodiment shown, four package regions 2901A, 2901B, 2901C, and 2901D are included on the wafer allowing for four final package components to be fabricated on a single wafer and later singulated. For example, individual package components may be singulated after forming the conductive connectors 170 as shown in FIG. 21, after incorporating the integrated circuit package no as shown in FIG. 22, or after the protective ring 160 is installed as shown in FIG. 23A. Fewer or more package regions may be utilized on a single wafer in other embodiments. The individual package components may be singulated, for example, by sawing through the redistribution structure 120 and the encapsulant 190 (see, e.g., FIG. 19) between core substrates 130, such that after singulation, the outside edges of the redistribution structure 120 and encapsulant 190 are coplanar along the singulation lines. The individual package regions are singulated by sawing along lines 2920 and around the outer edges of package regions 101A, 101B, 101C, and 101D.

Figure 26:
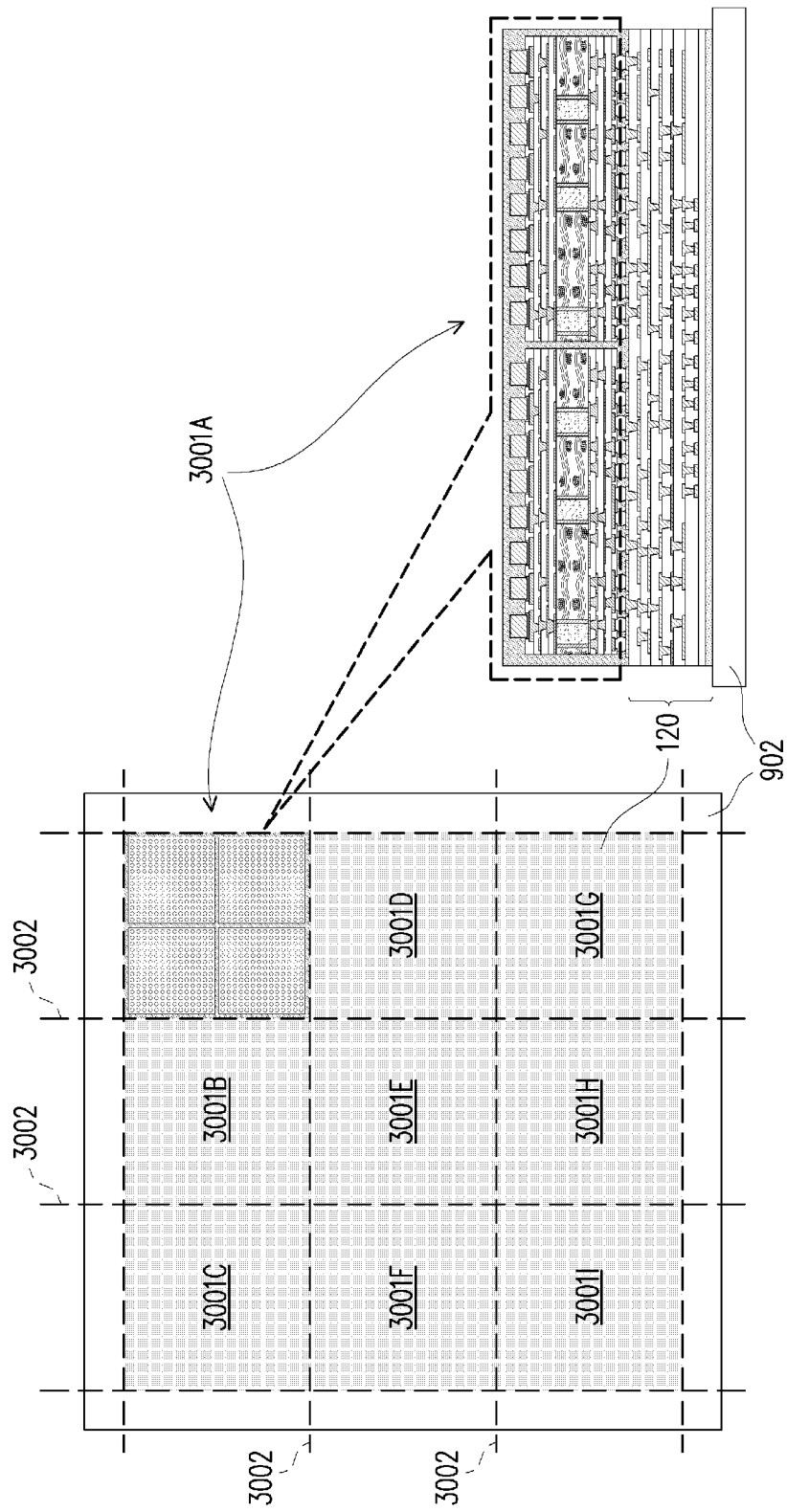
FIG. 26 illustrates a planar view of the layout of package regions on a panel substrate in accordance with some embodiments.

FIG. 26 illustrates the redistribution structure 120 being manufactured using a panel form fabrication process with multiple package regions. In the embodiment shown, nine package regions 101A through 101I are included on the panel substrate allowing for nine final package components to be fabricated on a single panel and later singulated. Fewer or more package regions may be utilized on a single panel in other embodiments. The individual package regions are singulated by sawing along lines 3002 and around the perimeter of package regions 101A through 101I.

Figure 27A:
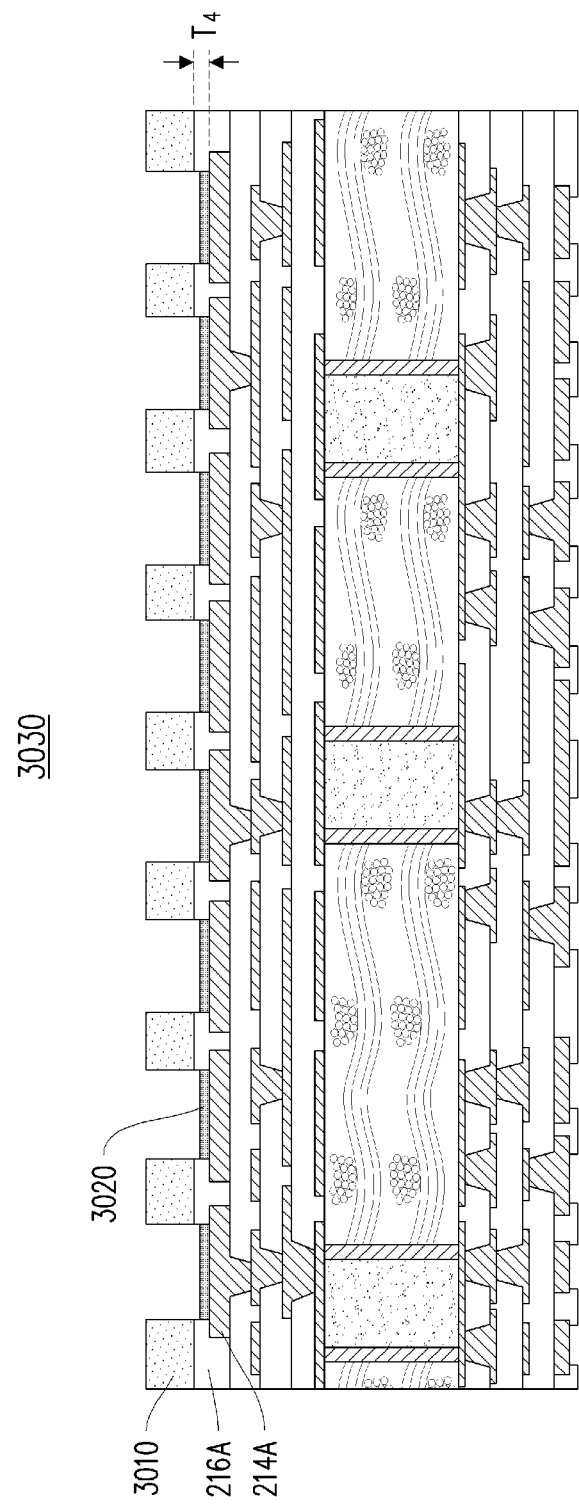
FIGS. 27A through 27D illustrate cross-sectional views of intermediate steps during a process for forming a package component in accordance with some embodiments.

FIGS. 27A-27D illustrate formation of the conductive posts 140 (see FIG. 1) using a conductive pin placement method, in accordance with some embodiments. Referring first to FIG. 27A, a first stencil 3010 is first placed on a core substrate 3030 to mask off areas of the core substrate 3030, to which a solder paste 3020 is not to be applied, and exposing portions of the UBMs 214A. Solder paste 3020 is then applied to the exposed areas of the UBMs 214A, and the first stencil 3010 is removed. In some embodiments, as shown in FIG. 27A, a thickness $T_4$ of the solder paste 3020 may be applied between 2 μm and 30 μm thick.

Figure 27B:
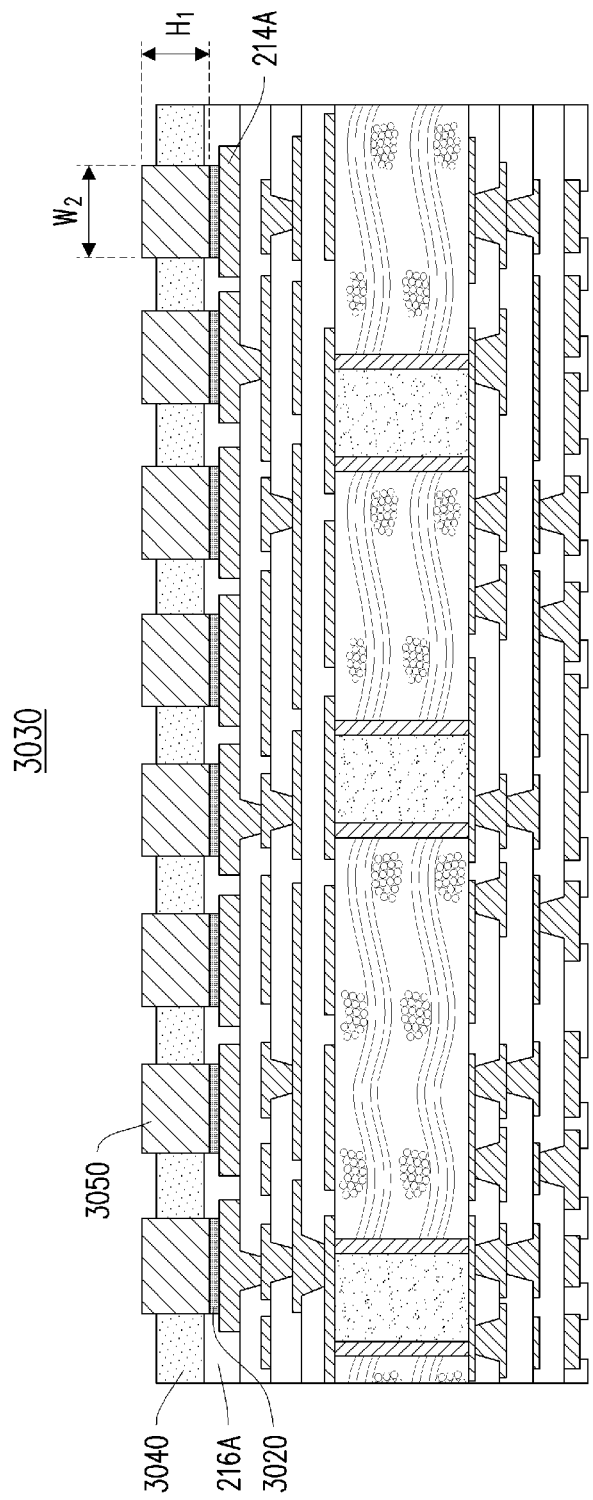

As shown in FIG. 27B, a second stencil 3040 is placed on the core substrate 3030, wherein the second stencil 3040 has openings exposing portions of the solder paste 3020 formed over the UBMs 214A, and where the conductive pins 3050 are to be placed. The conductive pins 3050, are then placed on the solder paste 3020, and the UBMs 214A, with the aid of the second stencil 3040. In some embodiments, the conductive pins 3050 may be formed of copper, or other suitable conductive material. In some embodiments, as shown in FIG. 27B, the conductive pins 3050 may have a height $H_1$ between 50 μm and 1,000 μm and a width $W_2$ between 100 μm and _1,000_μm.

Figure 27C:
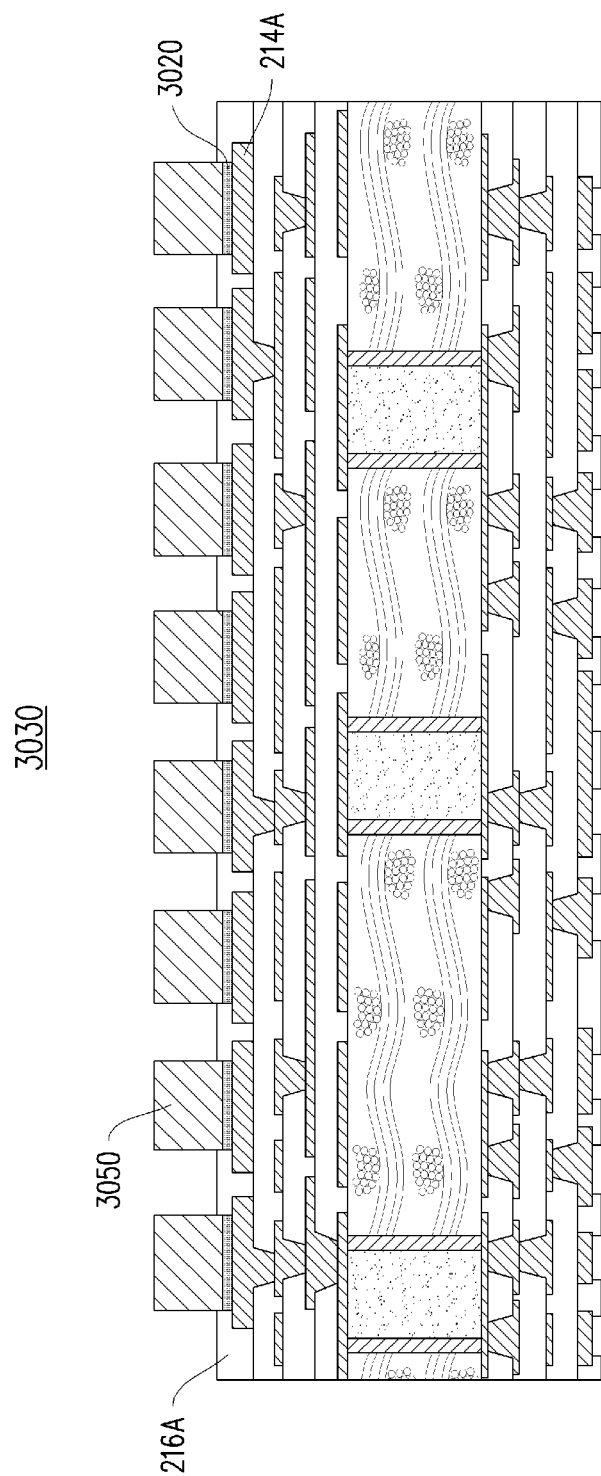
Figure 27D:
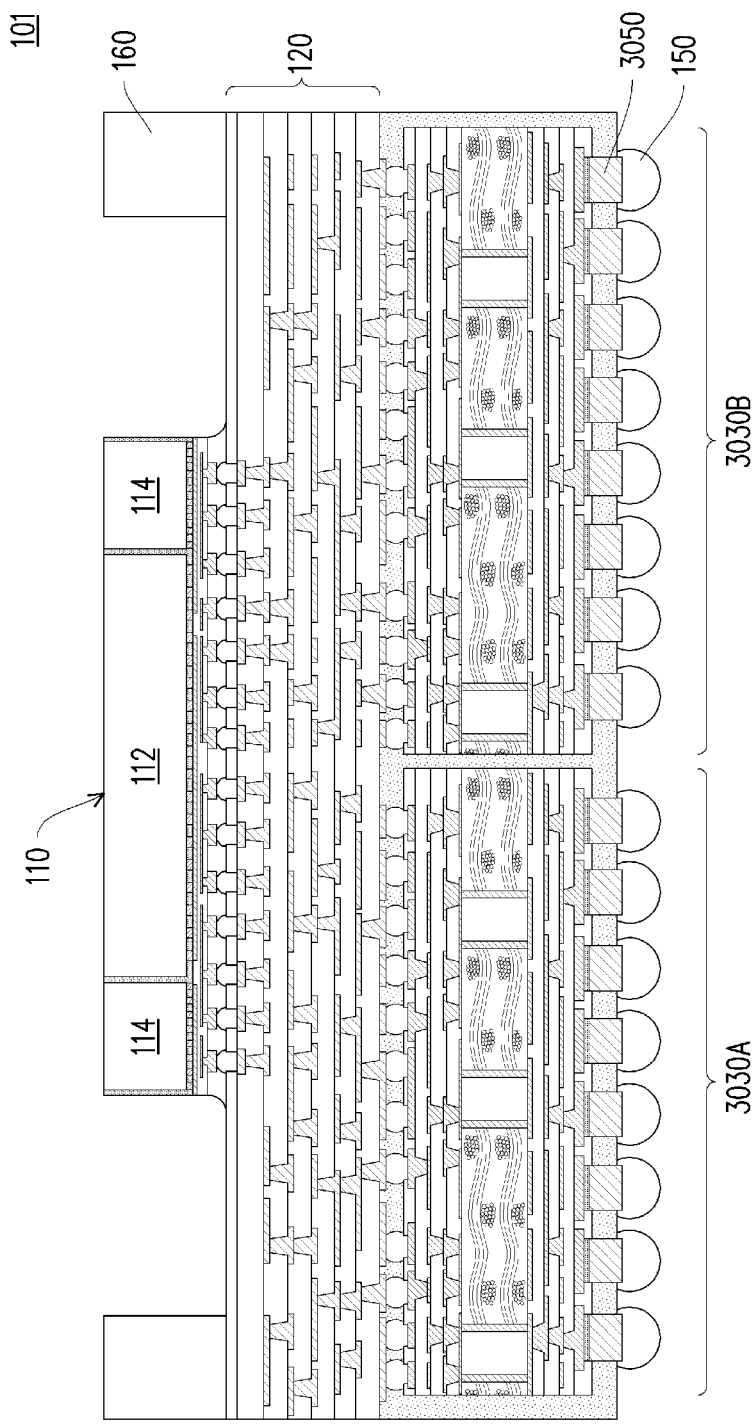

As shown in FIG. 27C, the second stencil 3040 is removed and a reflow process is used to bond the conductive pins 3050 to the UBMs 214A via the reflowed solder paste 3020. Conductive connectors 180 may then be added to the core substrate 3030 similar to as described in relation to FIG. 8 above. Subsequent processing steps described in FIGS. 9-26 may then be performed using one or more core substrates 3030. For example, FIG. 27D illustrates a singulated package component 101 that may be formed using steps such as those discussed above with reference to FIGS. 9-26 using core substrates 3030A and 3030B.

Figure 28A:
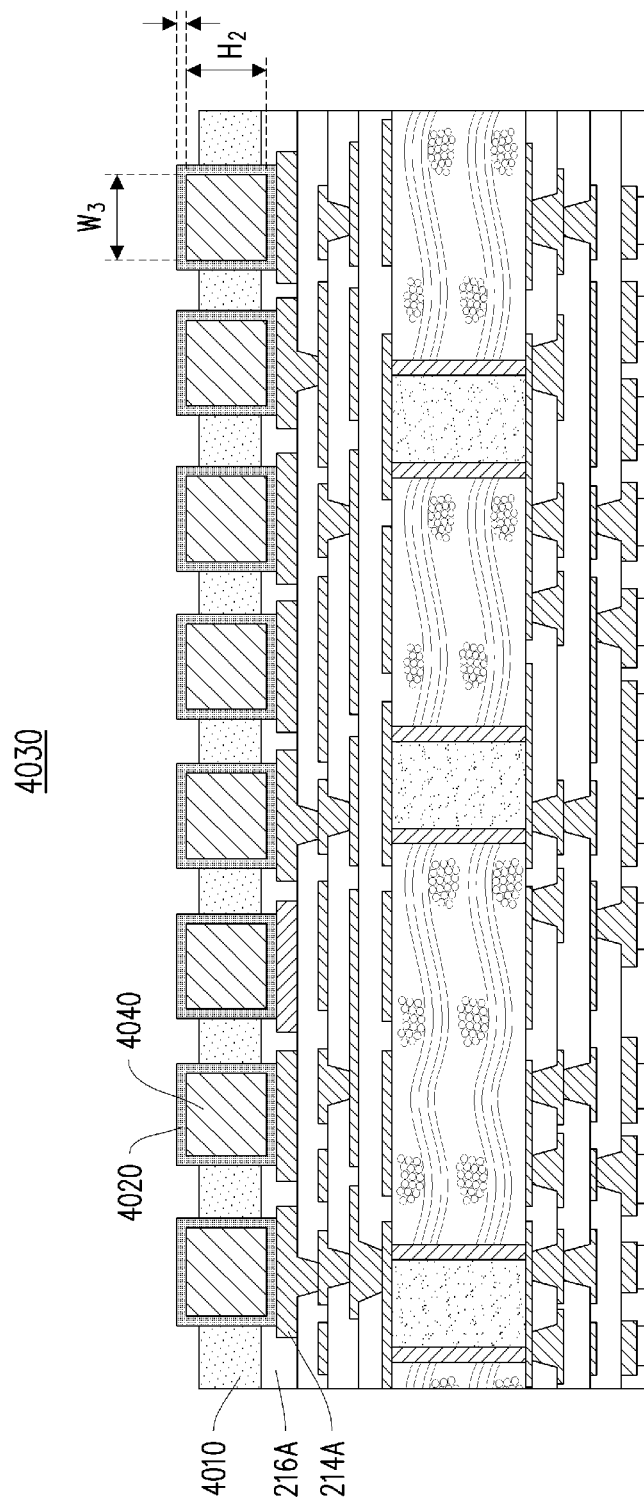
FIGS. 28A through 28C illustrate cross-sectional views of intermediate steps during a process for forming a package component in accordance with some embodiments.
Figure 28B:
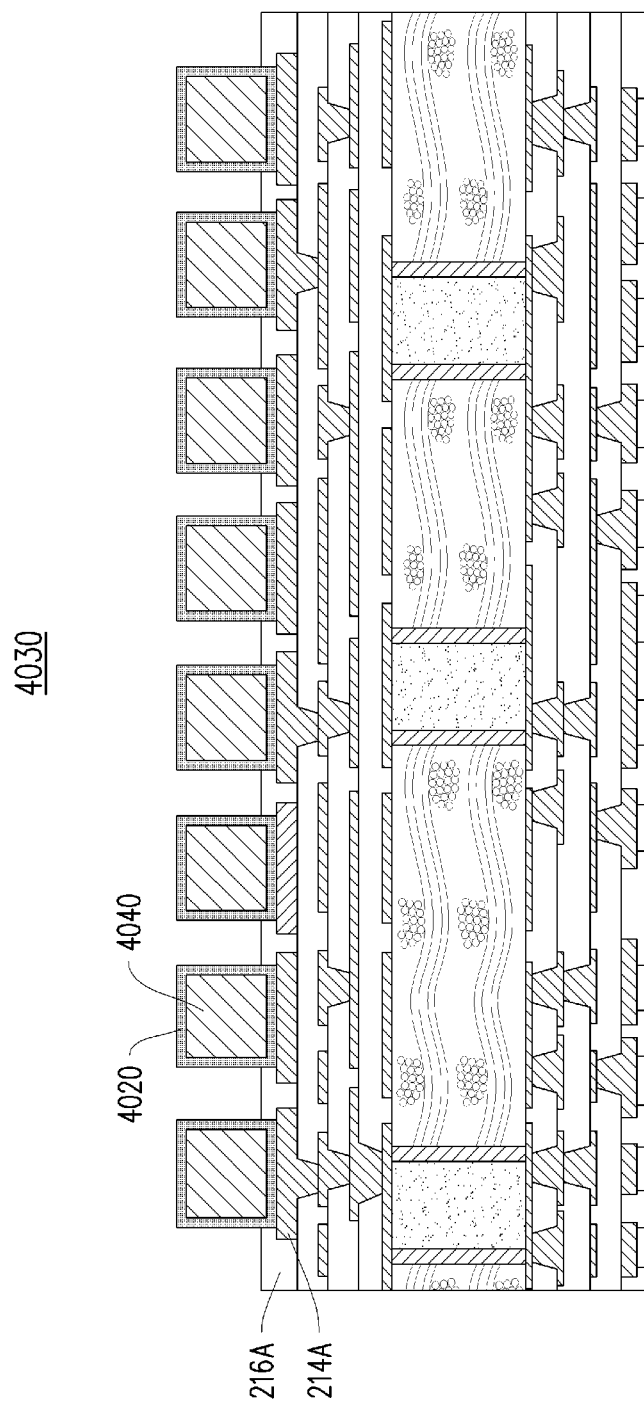

In some embodiments, the solder paste, may be applied to the conductive pins prior to placement on the UBMs 214A, and the first stencil and solder paste application to the core substrate described above may be omitted. For example, as shown in FIG. 28A, a stencil 4010 is placed on a core substrate 4030 to mask off areas of the core substrate 4030 and exposing portions of the UBMs 214A. Conductive pins 4040, coated in solder paste 4020, are then placed on the UBMs 214A of core substrate 4030 with the aid of the stencil 4010. In some embodiments, the conductive pins 4040 may have a height $H_2$ between 50 μm and 1,000 μm and a width $W_3$ between 100 μm and 1,000 μm. In some embodiments, a thickness $T_5$ of the solder paste 4020 may be applied to the conductive pins 4040 between 1 μm and 15 μm thick. The stencil 4010 may be removed after placing the conductive pins 4040. A reflow process may be performed to bond the conductive pins 4040 to the UBMs 214A via the reflowed solder paste 4020.

Figure 28C:
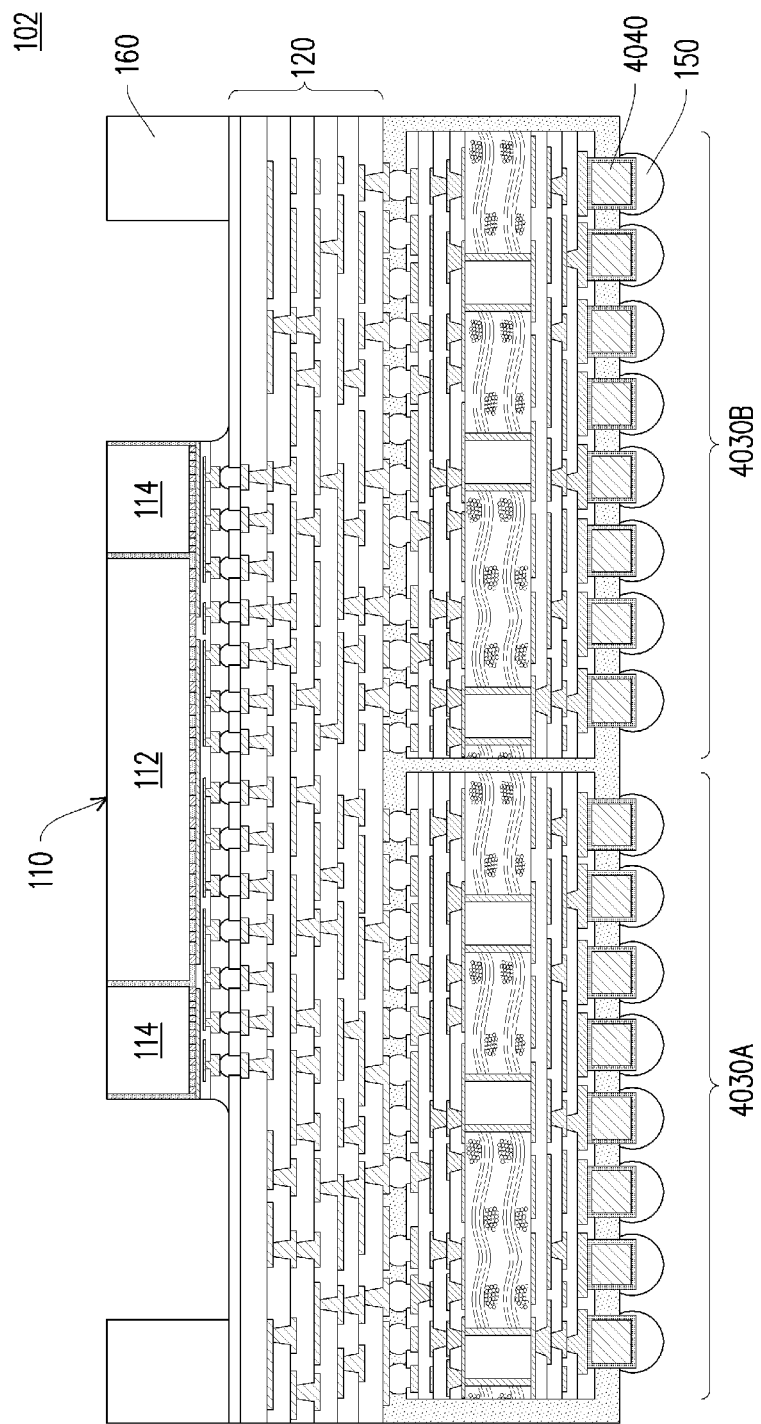

As shown in FIG. 28C, conductive connectors 180 may then be added to the core substrate 4030 similar to as described in relation to FIG. 8 above. Subsequent processing steps described in FIGS. 9-26 may then be performed using one or more core substrates 4030. For example, FIG. 28C illustrates a singulated package component 102 that may be formed using steps such as those discussed above with reference to FIGS. 9-26 using core substrates 4030A and 4030B.

Additionally, embodiments are foreseen in which different core substrates may be used in the same singulated package component. For example, one or more core substrates 4030, formed using the method where solder paste 4020 coats conductive pin 4040 prior to their placement, may be combined with one or more core substrates 3030, formed using the conductive pin placement method described with respect to FIGS. 27A-C, and/or combined with one or more core substrates 130 formed using the method described above with respect to FIGS. 2-8, in a single singulated package component. Other combinations are foreseeable based on this disclosure, and no limitation is intended on the combination of core substrate types which may be included in a single singulated package component.

Embodiments may achieve advantages. For example, because the multiple smaller core substrates can be used, higher substrate yields can be realized. Further, as the Cu posts mitigate the variation in thickness and package warpage between independent core substrates, BGA ball coplanarity across larger package sizes can be well managed. Further, due to the additional sidewall connection between the Cu posts and the BGA balls, increased board level reliability can be realized due to increased strength and adhesion between the singulated package component and the PCB to which it is ultimately mounted. Lastly, due to the use of internal connectors to mount the multiple core substrates to the redistribution structure, component reliability of the CPI and $C_4$ bump fatigue risk is reduced.

In an embodiment, a method for manufacturing a semiconductor device is provided, the method including forming a redistribution structure on a carrier substrate, connecting a plurality of core substrates physically and electrically to the redistribution structure, where each of the plurality of core substrates includes a conductive post on a side opposite the redistribution structure, encapsulating the plurality of core substrates with an encapsulant, where the encapsulant extends along sidewalls of the plurality of core substrates, where the encapsulant extends along a sidewall of the conductive post on each of the plurality of core substrates, where the encapsulant is interposed between adjacent ones of the plurality of core substrates, grinding a top of the encapsulant to expose the conductive post of each of the plurality of core substrates, and recessing the encapsulant to expose a portion of the sidewalls of the conductive post of each of the plurality of core substrates. In some embodiments, the method further includes forming an underfill between the plurality of core substrates and redistribution structure prior to encapsulating the plurality of core substrates. In some embodiments, the method further includes attaching an integrated circuit package to the redistribution structure, where the redistribution structure is interposed between the integrated circuit package and the plurality of core substrates, where the integrated circuit package laterally overlaps a first core substrate and a second core substrate of the plurality of core substrates. In some embodiments, the encapsulant includes a single layer extending between the redistribution structure and the plurality of core substrates, where the single layer of the encapsulant extends along sidewalls of the plurality of the core substrates from a lower surface of the plurality of core substrates to an upper surface of the plurality of core substrates. In some embodiments, the recessing exposes between 1 μm and 50 μm of the sidewall of the conductive posts. In some embodiments, the recessing is performed at least in part by performing a plasma etch. In some embodiments, connecting the plurality of core substrates to the redistribution structure is performed using a solder joint.

In another embodiment, a semiconductor device is provided, including a redistribution structure, a plurality of core substrates attached to the redistribution structure using conductive connectors, each core substrate of the plurality of core substrates including a plurality of conductive posts, and one or more molding layers encapsulating the plurality of core substrates, where the one or more molding layers extends along sidewalls of the plurality of core substrates, and where the one or more molding layers extends along a portion of a sidewall of each of the conductive posts. In some embodiments, the semiconductor device further includes an integrated circuit package attached to the redistribution structure, where the redistribution structure is interposed between the integrated circuit package and the plurality of core substrates, where the integrated circuit package laterally overlaps a first core substrate and a second core substrate of the plurality of core substrates. In some embodiments, the one or more molding layers include an underfill between the plurality of core substrates and the redistribution structure, and an encapsulant along the sidewalls of the plurality of core substrates, and over and around the underfill. In some embodiments, the plurality of conductive posts include copper, and between 1 μm and 50 μm of the sidewall of each conductive post of the plurality of conductive posts extends beyond a surface of one or more molding layers. In some embodiments, between 5 μm and 100 μm of the sidewall of each conductive post of the plurality of conductive posts are encapsulated with the one or more molding layers. In some embodiments, the redistribution structure and plurality of core substrates are separated by a distance of between 50 μm to 500 μm. In some embodiments, the semiconductor device further includes external connectors on the ends of the plurality of conductive posts, where the external connectors are a ball grid array (BGA) having a pitch between 0.6 and 1.0 millimeters (mm).

In another embodiment, a semiconductor device is provided, including a first redistribution structure, the first redistribution structure having a first side and a second side, a plurality of core substrates, each core substrate of the plurality of core substrates having a first side and a second side, the first side of each of the plurality of core substrates attached to the first side of the first redistribution structure using first conductive connectors, the second side of each core substrate of the plurality of core substrates including a plurality of conductive post, one or more molding layers encapsulating each core substrate of the plurality of core substrates, where the one or more molding layers extends along a portion of a sidewall of the conductive posts of each core substrate; and an integrated circuit package attached to the second side of the first redistribution structure by second conductive connectors. In some embodiments, the one or more molding layers include an underfill between the plurality of core substrates and the first redistribution structure, and an encapsulant along the sidewalls of the plurality of core substrates, and over and around the underfill. In some embodiments, the sidewall of the conductive posts extends beyond the surface of the one or more molding layers by a distance in a range of 1 μm and 50 μm. In some embodiments, the first redistribution structure and plurality of core substrates are separated by a distance of between 50 μm to 500 μm. In some embodiments, the conductive posts are arranged in a grid array having a pitch between 0.6 mm and 1.0 mm. In some embodiments, the semiconductor device further includes a protective ring attached to the second side of the first redistribution structure encircling the integrated circuit package.

What is claimed is:

1. A method for manufacturing a semiconductor device, the method comprising:
   forming a redistribution structure on a carrier substrate;
   connecting a plurality of core substrates physically and electrically to a second side of the redistribution structure, opposite the carrier substrate attached to a first side of the redistribution structure, wherein each of the plurality of core substrates comprises a conductive post on a side opposite the redistribution structure; encapsulating the plurality of core substrates with an encapsulant, wherein the encapsulant extends along sidewalls of the plurality of core substrates, wherein the encapsulant extends along a sidewall of the conductive post on each of the plurality of core substrates, and wherein the encapsulant is interposed between adjacent ones of the plurality of core substrates;
   forming an underfill between the plurality of core substrates and the redistribution structure prior to encapsulating the plurality of core substrates, wherein the underfill is the same material as the encapsulant and formed in a same process as forming the encapsulant;
   grinding a top of the encapsulant to expose the conductive post of each of the plurality of core substrates; and
   recessing the encapsulant to expose a portion of the sidewall of the conductive post of each of the plurality of core substrates.

2. The method of claim 1, further comprising attaching an integrated circuit package to the redistribution structure, wherein the redistribution structure is interposed between the integrated circuit package and the plurality of core substrates, and wherein the integrated circuit package laterally overlaps a first core substrate and a second core substrate of the plurality of core substrates.

3. The method of claim 1, wherein the encapsulant comprises a single layer extending between the redistribution structure and the plurality of core substrates, and wherein the single layer of the encapsulant extends along the sidewalls of the plurality of the core substrates from a lower surface of the plurality of core substrates to an upper surface of the plurality of core substrates.

4. The method of claim 1, wherein recessing exposes between 1 μm and 50 μm of the sidewall of the conductive post of each of the plurality of core substrates.

5. The method of claim 1, wherein the recessing the encapsulant comprises performing a plasma etch.

6. The method of claim 1, wherein the plurality of core substrates are connected to the redistribution structure using solder joints.

7. A method for forming a semiconductor device comprising:
  forming a first core substrate, wherein forming the first core substrate comprises:
    forming a first mask on a first side of the first core substrate;
    forming a seed layer over a second side of the first core substrate, wherein the second side of the first core substrate is opposite the first side, and wherein the seed layer is formed over one or more under-bump metallurgies (UBMs) of the first core substrate;
    forming a second mask layer on the second side of the first core substrate over the seed layer, wherein the second mask layer is patterned to expose portions of the seed layer corresponding to the one or more UBMs;
    forming at least one conductive post on the exposed portions of the seed layer on the second side of the first core substrate; and
    removing the first mask, the second mask layer, and portions of the seed layer not covered by the at least one conductive post;
  bonding the first core substrate to a redistribution structure;
  encapsulating the first core substrate with an encapsulant, wherein the encapsulant extends along sidewalls of the at least one conductive post;
  planarizing a top surface of the encapsulant to expose the at least one conductive post; and
  recessing the encapsulant to expose a portion of the sidewalls of the at least one conductive post.

8. The method of claim 7, further comprising, before encapsulating the first core substrate:
  forming an underfill between the first core substrate and the redistribution structure, wherein the underfill is the same material as the encapsulant.

9. The method of claim 7, further comprising attaching an integrated circuit package to the redistribution structure, opposite the first core substrate.

10. The method of claim 7, wherein the encapsulant comprises a single layer extending between the redistribution structure and the first core substrate, and wherein the encapsulant does not encapsulate any portion of a sidewall of the redistribution structure.

11. The method of claim 7, wherein recessing the encapsulant to expose a portion of the sidewalls of the at least one conductive post recessing the encapsulant to expose between 1 μm and 50 μm of the sidewalls of the at least one conductive post.

12. The method of claim 11, wherein recessing the encapsulant to expose the sidewalls of the at least one conductive post comprises performing a plasma etch.

13. A method for manufacturing a semiconductor device, the method comprising:
  forming a redistribution structure over a carrier substrate;
  bonding a plurality of core substrates over the redistribution structure, wherein each of the plurality of core substrates comprises a conductive post on a side opposite the redistribution structure;
  encapsulating the plurality of core substrates with an encapsulant, wherein the encapsulant extends along sidewalls of the plurality of core substrates, wherein the encapsulant-extends along a sidewall of the conductive post on each of the plurality of core substrates, wherein the encapsulant is interposed between adjacent ones of the plurality of core substrates, and wherein the encapsulant extends between the plurality of core substrates and the redistribution structure;
  recessing the encapsulant to expose a portion of the sidewall of the conductive post of each of the plurality of core substrates;
  after recessing the encapsulant, removing the carrier substrate; and
  bonding an integrated circuit package to an opposing side of the redistribution structure as the plurality of core substrates.

14. The method of claim 13, wherein the integrated circuit package comprises at least a logic die and an input/output (I/O) die.

15. The method of claim 13 further comprising attaching a protective ring to the redistribution structure to encircle the integrated circuit package.

16. The method of claim 13, wherein the encapsulant does not cover any portion of a sidewall of the redistribution structure.

17. The method of claim 13, wherein the method further comprises forming an external connector on each conductive post of each of the plurality of core substrates.

18. The method of claim 17, wherein forming an external connector on each conductive post comprises:
  forming a layer of reflowable material on each conductive post of each of the plurality of core substrates; and
  reflowing the reflowable material to shape the reflowable material into the external connector that surrounds a top surface of each conductive post, and a portion of the sidewalls of each conductive post.

19. The method of claim 13, wherein forming the conductive posts on the side opposite the redistribution structure of at least one core substrate of the plurality of core substrates comprises, before bonding the core substrate to the redistribution structure:
  forming a first mask on a first side of the at least one core substrate exposing under-bump metallurgies (UBMs) of the at least one core substrate, wherein the first side is opposite the side on which the redistribution structure will be bonded;
  forming conductive posts on the exposed portions of the UBMs of the at least one core substrate; and
  remove the first mask.

20. The method of claim 19, wherein forming the conductive post on the side opposite the redistribution structure of at least one core substrate of the plurality of core substrates comprises, before forming the first mask, forming a seed layer over the first side of the at least one core substrate; and wherein removing the first mask further comprises removing portions of the seed layer not covered by the conductive posts.

* * * * *